United States Patent
Ishigami et al.

(10) Patent No.: US 9,219,218 B2
(45) Date of Patent: Dec. 22, 2015

(54) METHOD OF MANUFACTURING ELECTRIC WIRING LAYER, MEMBER FOR FORMING ELECTRIC WIRING LAYER, ELECTRIC WIRING LAYER, METHOD OF MANUFACTURING ELECTRIC WIRING BOARD, MEMBER FOR FORMING ELECTRIC WIRING BOARD, ELECTRIC WIRING BOARD, VIBRATOR, ELECTRONIC APPARATUS, AND MOVING OBJECT

(71) Applicant: Seiko Epson Corporation, Tokyo (JP)

(72) Inventors: Hideki Ishigami, Hachinohe (JP);
Hidefumi Nakamura, Hachinohe (JP);
Yukihiko Shiohara, Hachinohe (JP);
Taku Kawasaki, Hachinohe (JP);
Fumiaki Akahane, Hachinohe (JP)

(73) Assignee: Seiko Epson Corporation (JP)

( * ) Notice: Subject to any disclaimer, the term of this patent is extended or adjusted under 35 U.S.C. 154(b) by 0 days.

(21) Appl. No.: 14/578,991

(22) Filed: Dec. 22, 2014

(65) Prior Publication Data

US 2015/0188024 A1 Jul. 2, 2015

(30) Foreign Application Priority Data

Dec. 27, 2013 (JP) ................................. 2013-272610

(51) Int. Cl.
| | |
|---|---|
| H05K 1/09 | (2006.01) |
| H05K 1/03 | (2006.01) |
| H01L 41/047 | (2006.01) |
| H01L 41/053 | (2006.01) |
| H01L 41/333 | (2013.01) |
| H01L 41/29 | (2013.01) |
| B22F 5/12 | (2006.01) |
| B22F 3/105 | (2006.01) |

(52) U.S. Cl.
CPC .......... *H01L 41/0475* (2013.01); *B22F 3/1055* (2013.01); *B22F 5/12* (2013.01); *H01L 41/0533* (2013.01); *H01L 41/29* (2013.01); *H01L 41/333* (2013.01); *H05K 1/0306* (2013.01); *H05K 2201/0215* (2013.01); *H05K 2201/0224* (2013.01)

(58) Field of Classification Search
CPC ............ H01L 41/0475; H01L 41/0533; H01L 41/333; H01L 41/29; H05K 1/0306; H05K 2201/0224; H05K 2201/0215; B22F 3/1055; B22F 5/12
USPC ........... 174/251, 258; 252/500; 257/365, 698, 257/734, 738, E23.067, E23.151, E21.514, 257/E21.627; 428/209; 438/455, 612, 618
See application file for complete search history.

(56) References Cited

U.S. PATENT DOCUMENTS 6,238,599 B1 * 5/2001 Gelorme et al. ............... 252/514
7,683,473 B2 * 3/2010 Kasai et al. .................... 257/698
(Continued)

FOREIGN PATENT DOCUMENTS

| JP | 61-279194 | 12/1986 |
|---|---|---|
| JP | 10-303061 | 11/1998 |
| JP | 2009-295661 A | 12/2009 |

*Primary Examiner* — Dao H Nguyen
(74) *Attorney, Agent, or Firm* — Harness, Dickey & Pierce, P.L.C.

(57) ABSTRACT

A method of manufacturing an electric wiring layer including an electric wiring includes obtaining a pressed powder molded layer by pressurizing a powder including a metal particle with an insulating layer, the metal particle being constituted by a metal particle having conductivity and a surface insulating layer which is located on a surface of the metal particle and which mainly contains a glass material; and irradiating the pressed powder molded layer with energy rays and forming the electric wiring in an irradiation region.

18 Claims, 18 Drawing Sheets

(56) References Cited

U.S. PATENT DOCUMENTS

| | | | |
|---|---|---|---|
| 2007/0059503 A1* | 3/2007 | Park et al. | 428/209 |
| 2010/0327232 A1* | 12/2010 | Yamamoto et al. | 252/500 |
| 2013/0136645 A1* | 5/2013 | Sekine et al. | 419/8 |
| 2014/0110153 A1* | 4/2014 | Kashiwagi et al. | 174/251 |

\* cited by examiner

METHOD OF MANUFACTURING ELECTRIC WIRING LAYER, MEMBER FOR FORMING ELECTRIC WIRING LAYER, ELECTRIC WIRING LAYER, METHOD OF MANUFACTURING ELECTRIC WIRING BOARD, MEMBER FOR FORMING ELECTRIC WIRING BOARD, ELECTRIC WIRING BOARD, VIBRATOR, ELECTRONIC APPARATUS, AND MOVING OBJECT

BACKGROUND

1. Technical Field

The present invention relates to a method of manufacturing an electric wiring layer, a member for forming an electric wiring layer, an electric wiring layer, a method of manufacturing an electric wiring board, a member for forming an electric wiring board, an electric wiring board, a vibrator, an electronic apparatus, and a moving object.

2. Related Art

Ceramic wiring boards are more excellent than organic wiring boards from the viewpoint of thermal conductivity, heat resistance, chemical stability, and the like, and thus enable the high density of wiring boards and contribute to a reduction in the size of electronic apparatuses.

Such a ceramic wiring board is known to include, for example, a ceramic substrate, a base pattern, formed of W or Mo, which is laid on the surface of the ceramic substrate, and a wiring pattern, formed of Cu, which is provided on the surface of the base pattern (for example, see JP-A-2009-295661).

The ceramic wiring board disclosed in JP-A-2009-295661 is manufactured through a process of applying a conductive paste mainly containing W or Mo to the front surface or the rear surface of a ceramic formed body formed of a mixture of a ceramic powder raw material and an organic binder, a process of obtaining a ceramic substrate having a base pattern formed therein by simultaneously baking the ceramic formed body and the conductive paste, and a process of obtaining a wiring pattern by forming a film of Cu on the surface of the base pattern by a plating method.

In such a ceramic wiring board, the base pattern is provided between the ceramic substrate and the wiring pattern to secure adhesion therebetween. However, since the base pattern needs to be formed, the number of manufacturing processes is increased, and thus there is a problem in that manufacturing efficiency is low.

In addition, when the base pattern is not present, adhesion between the ceramic substrate and the wiring pattern is decreased, and thus there is a concern that a problem such as the peeling-off of the wiring pattern may occur.

On the other hand, JP-A-10-303061 suggests a capacitor in which a heating conductive insulating material having conductive particles distributed in a thermoplastic insulating material is used for a removal processing electrode (trimming electrode). In the capacitor, when the removal processing electrode is irradiated with a laser, the thermoplastic insulating material and the conductive particles are melted, and the conductive particles are connected to each other, thereby allowing the electrical conduction of an irradiation region to be made. That is, in the removal processing electrode, the conductive particles are initially insulated from each other by the thermoplastic insulating material. However, the electrical conduction of the irradiation region can be achieved by the irradiation with a laser. For this reason, the above document discloses that it is possible to adjust the capacitance of the capacitor by the irradiation with a laser.

Consequently, a coating is formed on a ceramic substrate using the heating conductive insulating material disclosed in JP-A-10-303061, and the coating is irradiated with a laser, and thus it is possible to form a wiring pattern corresponding to an irradiation mark.

However, JP-A-10-303061 discloses that rosin, various types of rubber, a thermoplastic rigid resin, and the like are used as the thermoplastic insulating material. These materials have low heat resistance. Accordingly, for example, when soldering is performed on the formed wiring pattern, the heating conductive insulating material cannot withstand the temperature of the soldering. For this reason, the electrical conduction of the heating conductive insulating material in a region which is not irradiated with a laser is also made due to the soldering, and thus a problem such as a decrease in an insulation property between the wiring patterns occurs.

SUMMARY

An advantage of some aspects of the invention is to provide an electric wiring layer provided with an electric wiring having a desired pattern, a method of manufacturing an electric wiring layer which is used to be capable of efficiently manufacturing the electric wiring layer, a member for forming an electric wiring layer which is suitably used to form the electric wiring layer, an electric wiring board including an electric wiring having a desired pattern which is provided on a substrate, a method of manufacturing an electric wiring board which is used to be capable of efficiently manufacturing the electric wiring board, a member for forming an electric wiring board which is suitably used to form the electric wiring board, and a vibrator, an electronic apparatus, and a moving object which include the electric wiring layer or the electric wiring board.

An aspect of the invention is directed to a method of manufacturing an electric wiring layer including an electric wiring, the method including obtaining a pressed powder molded layer by pressurizing a powder including a metal particle with an insulating layer, the metal particle being constituted by a metal particle having conductivity and a surface insulating layer which is located on a surface of the metal particle and which mainly contains a glass material; and irradiating the pressed powder molded layer with energy rays and forming the electric wiring in an irradiation region.

With this configuration, the irradiation region of energy rays is appropriately selected, and thus it is possible to easily form the electric wiring having a desired pattern. For this reason, it is possible to efficiently manufacture the electric wiring layer. In addition, an insulating region is obtained in a non-irradiation region. However, the insulating region includes metal particles, and thus has high thermal conductivity derived from a metal material. Moreover, the insulating region includes a glass material, and thus has higher thermal conductivity than a resin material. Therefore, the electric wiring layer manufactured in the aspect of the invention has excellent heat radiation. Further, the electric wiring layer includes a glass material but does not substantially include a resin material, and thus has high heat resistance and low gas adsorption (gas emission). For this reason, the electric wiring layer has heat resistance capable of withstanding, for example, soldering work and solder reflow processing. In addition, even when the electric wiring layer is used as a portion of a package that defines a sealed space, it is possible to suppress an increase in pressure and the contamination of the sealed space due to a discharged gas.

In the method of manufacturing an electric wiring layer according to the aspect of the invention, it is preferable that the metal particle with an insulating layer is manufactured by fixing the glass material to the surface of the metal particle.

With this configuration, since the metal particle with an insulating layer can be manufactured under drying and in an inert gas, there is less concern that moisture and the like may enter a space between the metal particle and the surface insulating layer, and thus it is possible to suppress the degeneration and deterioration of the metal particle over a long period of time. In addition, the glass material is mechanically attached. Thus, even when foreign substances, an oxide film, or the like are attached to the surface of the metal particle, it is possible to form the surface insulating layer while removing or destroying the attached substances. For this reason, the metal particle with an insulating layer has a high level of cleanliness, and thus an electric wiring having high conductivity is obtained. Further, it is possible to form a glass material, which is hardly handled due to its high softening point, into a film as the surface insulating layer. For this reason, it is possible to use a wide variety of glass materials.

In the method of manufacturing an electric wiring layer according to the aspect of the invention, it is preferable that the pressed powder molded layer is obtained by pressurizing a powder containing the metal particle with an insulating layer and a glass particle.

With this configuration, the glass particle is interposed between the metal particles with an insulating layer as an interparticle insulating portion, and thus it is possible to fix the metal particles with an insulating layer and to secure the mechanical strength of the pressed powder molded layer.

In the method of manufacturing an electric wiring layer according to the aspect of the invention, it is preferable that a constituent material of the glass material is the same as that of the glass particle.

With this configuration, the glass material as a main material of the surface insulating layer and the glass particle interposed between the metal particles with an insulating layer may be softened at the same softening point and may be mixed with each other. Therefore, when the irradiation with energy rays is performed, the coupling between the metal particles is not likely to be hindered by the glass material. As a result, there is a tendency for the metal particles to be coupled to each other. For this reason, it is possible to form an electric wiring having high conductivity.

In the method of manufacturing an electric wiring layer according to the aspect of the invention, it is preferable that a volume of the glass particle is equal to or less than 65 when a sum of a volume of the metal particle with an insulating layer and the volume of the glass particle of the pressed powder molded layer is set to 100.

With this configuration, it is possible to increase the mechanical strength of the electric wiring layer while achieving both conductivity in the electric wiring and an insulation property in the insulating region.

It is preferable that the method of manufacturing an electric wiring layer according to the aspect of the invention further includes heating the pressed powder molded layer.

With this configuration, the glass particle mixed together with the glass material, which is a main material of the surface insulating layer, or the metal particle with an insulating layer is melted and is then solidified. Therefore, the metal particles with an insulating layer are fixed to each other, and thus the mechanical strength of the pressed powder molded layer is secured. As a result, it is possible to increase the shape retention of the pressed powder molded layer.

In the method of manufacturing an electric wiring layer according to the aspect of the invention, it is preferable that the metal particle is manufactured by a water atomization method or a high speed rotation water flow atomization method.

With this configuration, it is possible to efficiently manufacture an extremely minute powder. In addition, the shape of the obtained powder particle approaches a spherical shape by the action of surface tension, and thus the metal particle capable of increasing a filling rate at the time of molding is obtained.

Another aspect of the invention is directed to a member for forming an electric wiring layer including a pressed powder molded layer which includes a metal particle with an insulating layer, the metal particle being constituted by a metal particle having conductivity and a surface insulating layer which is located on a surface of the metal particle and which mainly contains a glass material, in which the member for forming an electric wiring layer is a member which exerts conductivity in an irradiation region by irradiating a portion thereof with energy rays and is capable of forming an electric wiring.

With this configuration, it is possible to easily form an electric wiring having a desired pattern only by irradiating an arbitrary region with energy rays. For this reason, the member for forming an electric wiring layer which is suitably used to form the electric wiring layer is obtained.

Still another aspect of the invention is directed to an electric wiring layer including an insulating region which includes a metal particle with an insulating layer, the metal particle being constituted by a metal particle having conductivity and a surface insulating layer which is located on a surface of the metal particle and which mainly contains a glass material; and an electric wiring which includes a particle-coupled body in which metal particles having conductivity are coupled to each other, in which the insulating region and the electric wiring are integrally formed.

With this configuration, the insulating region and the electric wiring are firmly connected to each other, and thus the mechanical strength in a boundary between the electric wiring and the insulating region is sufficiently increased. Therefore, the electric wiring layer capable of sufficiently suppressing the occurrence of a problem such as the peeling-off of the electric wiring is obtained.

Yet another aspect of the invention is directed to a method of manufacturing an electric wiring board which includes a substrate and an electric wiring layer including an electric wiring which is provided on one surface side of the substrate, the method including obtaining a pressed powder molded layer by pressurizing and molding a powder including a metal particle with an insulating layer on the substrate, the metal particle being constituted by a metal particle having conductivity and a surface insulating layer which is located on a surface of the metal particle and which mainly contains a glass material; and obtaining the electric wiring layer by irradiating the pressed powder molded layer with energy rays and by forming the electric wiring in an irradiation region.

With this configuration, the irradiation region of energy rays is appropriately selected, and thus it is possible to easily form the electric wiring having a desired pattern. For this reason, it is possible to efficiently manufacture the electric wiring board. In addition, an insulating region is obtained in a non-irradiation region. However, the insulating region includes metal particles, and thus has high thermal conductivity derived from a metal material. Moreover, the insulating region includes a glass material, and thus has higher thermal conductivity than a resin material. Therefore, the electric wiring board manufactured in the aspect of the invention has excellent heat radiation. Further, the electric wiring board includes a glass material but does not substantially include a resin material, and thus has high heat resistance and low gas adsorption (gas emission). For this reason, the electric wiring board has heat resistance capable of withstanding, for example, soldering work and solder reflow processing. In addition, even when the electric wiring board is used as a portion of a package that defines a sealed space, it is possible to suppress an increase in pressure and the contamination of the sealed space due to a discharged gas.

Still yet another aspect of the invention is directed to a member for forming an electric wiring board including a substrate; and a pressed powder molded layer which is provided on one surface side of the substrate and includes a metal particle with an insulating layer, the metal particle being constituted by a metal particle having conductivity and a surface insulating layer which is located on a surface of the metal particle and which mainly contains a glass material, in which the member for forming an electric wiring board is a member which exerts conductivity in an irradiation region by irradiating a portion of the pressed powder molded layer with energy rays and which is capable of forming an electric wiring.

With this configuration, it is possible to easily form an electric wiring having a desired pattern only by irradiating an arbitrary region with energy rays. For this reason, the member for forming an electric wiring board which is suitably used to form the electric wiring board is obtained.

Further another aspect of the invention is directed to an electric wiring board including a substrate; and an electric wiring layer which is provided on one surface side of the substrate and includes an insulating region and an electric wiring, in which the insulating region includes a metal particle with an insulating layer being constituted by a metal particle having conductivity and a surface insulating layer which is located on a surface of the metal particle and which mainly contains a glass material, and the electric wiring includes a particle-coupled body in which metal particles having conductivity are coupled to each other, in which the insulating region and the electric wiring are integrally formed in the electric wiring layer.

With this configuration, the insulating region and the electric wiring are firmly connected to each other, and thus the mechanical strength in a boundary between the electric wiring and the insulating region is sufficiently increased. Therefore, the electric wiring board capable of sufficiently suppressing the occurrence of a problem such as the peeling-off of the electric wiring is obtained.

Still further another aspect of the invention is directed to a vibrator including a package which includes the electric wiring layer according to the aspect of the invention or the electric wiring board according to the aspect of the invention and a lid member which is bonded to the electric wiring layer or the electric wiring board; and a vibrator element which is accommodated in the package.

With this configuration, the vibrator capable of achieving miniaturization and cost reduction is obtained.

Yet further another aspect of the invention is directed to an electronic apparatus including the electric wiring layer according to the aspect of the invention or the electric wiring board according to the aspect of the invention.

With this configuration, the electronic apparatus including the electric wiring layer or the electric wiring board having high reliability is obtained.

Still yet further another aspect of the invention is directed to a moving object including the electric wiring layer according to the aspect of the invention or the electric wiring board according to the aspect of the invention.

With this configuration, the moving object including the electric wiring layer or the electric wiring board having high reliability is obtained.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a method of manufacturing an electric wiring layer, a member for forming an electric wiring layer, an electric wiring layer, a method of manufacturing an electric wiring board, a member for forming an electric wiring board, an electric wiring board, a vibrator, an electronic apparatus, and a moving object will be described in detail with reference to preferred embodiments shown in the accompanying drawings. Vibrator and Electric Wiring Layer
First Embodiment First, a first embodiment of a vibrator according to the invention and a first embodiment of an electric wiring layer according to the invention will be described.

Figure 1:
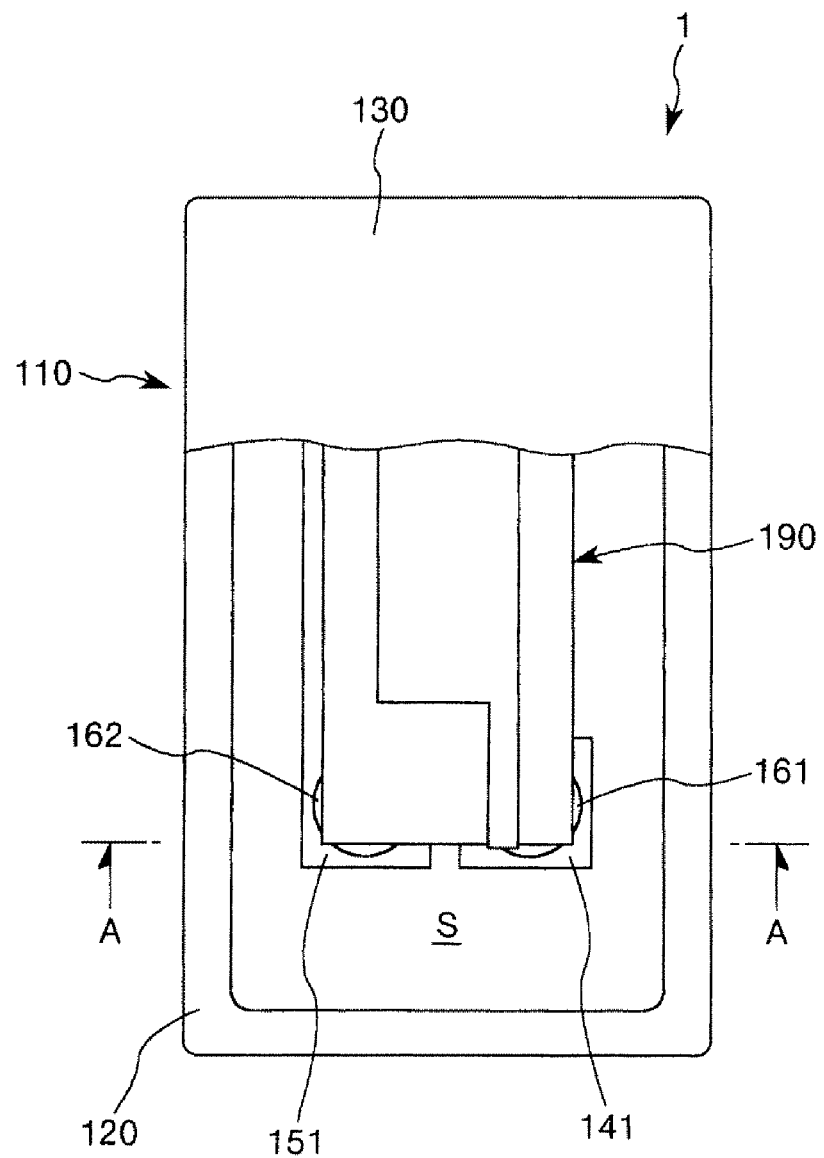
FIG. 1 is a plan view showing a vibrator according to a first embodiment of the invention.
Figure 2:
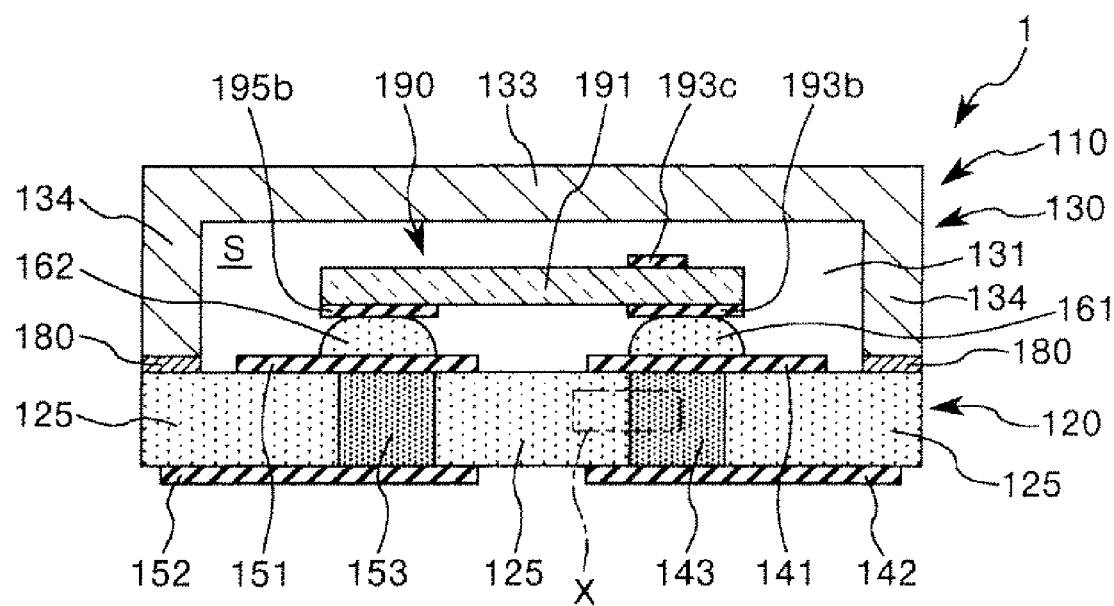
FIG. 2 is a cross-sectional view taken along line A-A in FIG. 1.
Figure 3A:
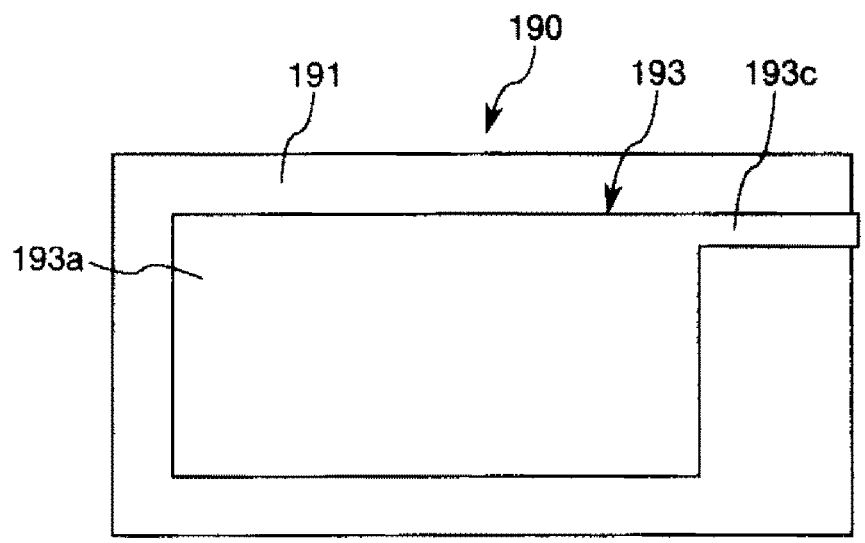
FIGS. 3A and 3B are plan views of a vibrator element included in the vibrator shown in FIG. 1.
Figure 3B:
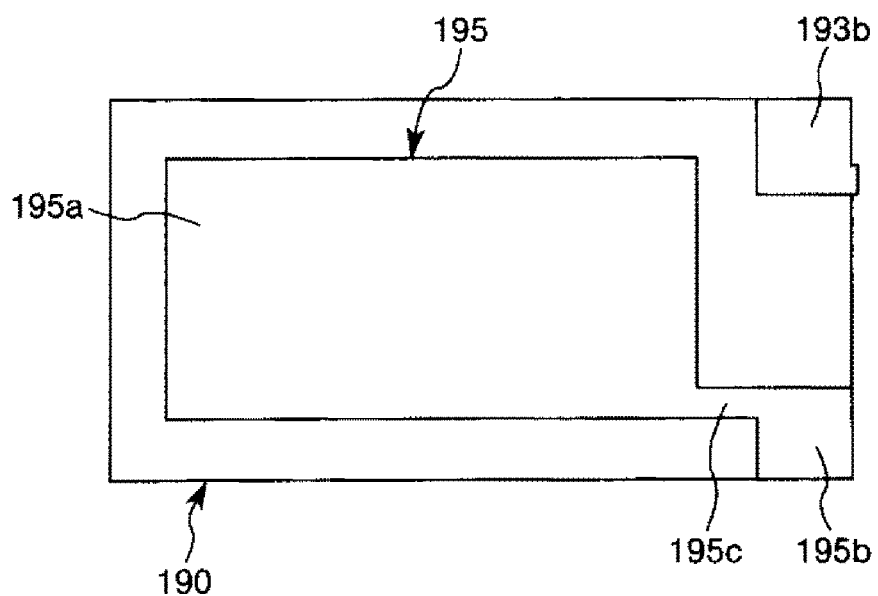

FIG. 1 is a plan view showing a vibrator according to a first embodiment of the invention. FIG. 2 is a cross-sectional view taken along line A-A in FIG. 1. FIGS. 3A and 3B are plan views of a vibrator element included in the vibrator shown in FIG. 1. Hereinafter, a description will be given on the assumption that an upper side in FIG. 2 is "up" and a lower side is "down".

As shown in FIGS. 1 and 2, a vibrator 1 includes a package 110 and a vibrator element 190 accommodated in the package 110.
Vibrator Element As shown in FIGS. 3A and 3B, the vibrator element 190 includes a piezoelectric substrate (vibration substrate) 191 having a rectangular plate shape when seen in a plan view and a pair of electrode layers 193 and 195, having conductivity, which are formed on the surface of the piezoelectric substrate 191. FIG. 3A is a plan view when an upper surface of the vibrator element 190 is viewed from above, and FIG. 3B is a transmission view (plan view) when a lower surface of the vibrator element 190 is seen from above.

The piezoelectric substrate 191 is a quartz crystal blank plate that mainly generates a thickness shear vibration.

In this embodiment, a quartz crystal blank plate cut out at a cut angle called an AT-cut is used as the piezoelectric substrate 191. Meanwhile, the AT-cut refers to cut-out performed in order to have a principal surface (principal surface including an X-axis and a Z'-axis) which is obtained by rotating a plane (Y-plane) including an X-axis and a Z-axis, which are crystal axes of a quartz crystal, counterclockwise about the X-axis from the Z-axis by approximately 35° 15' degrees.

In addition, the longitudinal direction of the piezoelectric substrate 191 is coincident with the X-axis which is a crystal axis of a quartz crystal.

The electrode layer 193 includes an excitation electrode 193a formed on the piezoelectric substrate 191, a bonding pad 193b formed under the piezoelectric substrate 191, and a wiring 193c that electrically connects the excitation electrode 193a and the bonding pad 193b.

On the other hand, the electrode layer 195 includes an excitation electrode 195a formed under the piezoelectric substrate 191, a bonding pad 195b formed under the piezoelectric substrate 191, and a wiring 195c that electrically connects the excitation electrode 195a and the bonding pad 195b.

The excitation electrode 193a and the excitation electrode 195a are provided so as to face each other through the piezoelectric substrate 191 and have substantially the same shape. That is, when the piezoelectric substrate 191 is viewed in a plan view, the excitation electrode 193a and the excitation electrode 195a are located so as to overlap each other and are formed so that the outlines thereof are substantially coincident with each other.

In addition, the bonding pads 193b and 195b are formed at a right end of a lower surface of the piezoelectric substrate 191 in FIG. 3B so as to be separated from each other.

Meanwhile, the quartz crystal blank plate of AT-cut has been described above as an example. However, the cut angle is not particularly limited, and a Z-cut, a BT-cut, or the like may be performed. In addition, the shape of the piezoelectric substrate 191 is not particularly limited, and shapes such as a two-legged tuning fork shape, an H-shaped tuning fork shape, a three-legged tuning fork shape, a comb tooth shape, an orthogonal shape, and a rectangular column shape may be used.

In addition, the constituent material of the piezoelectric substrate 191 is not limited to quartz crystal, and may be other piezoelectric materials, silicon, or the like.

Further, the vibrator 1 may be used not only as a timing source, but also as a sensor that detects a physical quantity such as pressure, acceleration, or angular velocity.
Package As shown in FIGS. 1 and 2, the package 110 includes a plate-shaped base 120 and a lid 130 having a concave portion 131 which opens downward. In such a package 110, the concave portion 131 is closed by the base 120. Thus, a defined space inside the concave portion 131 is used as an accommodation space S that accommodates the vibrator element 190 described above. Meanwhile, FIG. 1 shows the lid 130 of which a portion is notched.

The base 120 includes through electric wirings 143 and 153 passing therethrough in a thickness direction and an insulating region 125 provided in the vicinity of the through electric wirings 143 and 153. The base 120 is an embodiment of the electric wiring layer according to the invention.

In addition, a pair of connection electrodes 141 and 151 are provided on the base 120. On the other hand, a pair of external mounting electrodes 142 and 152 are formed under the base 120.

As described above, the base 120 is provided with the through electric wirings 143 and 153. Here, the connection electrode 141 and the external mounting electrode 142 are electrically connected to each other through the through electric wiring 143, and the connection electrode 151 and the external mounting electrode 152 are electrically connected to each other through the through electric wiring 153.

Constituent materials of the connection electrodes 141 and 151 and the external mounting electrodes 142 and 152 are not particularly limited. Examples of the constituent materials include a single body of a metal element such as gold (Au), platinum (Pt), aluminum (Al), silver (Ag), chromium (Cr), nickel (Ni), copper (Cu), molybdenum (Mo), niobium (Nb), tungsten (W), iron (Fe), titanium (Ti), cobalt (Co), zinc (Zn), or zirconium (Zr), or an alloy or complex including the metal elements.

Meanwhile, the through electric wirings 143 and 153 and the insulating region 125 will be described later in detail.

In addition, an outer edge portion of an upper surface of the base 120 is provided with a frame-shaped metalized layer not shown in the drawing. The metalized layer is used to increase adhesion between the base 120 and a brazing material 180 to be described later. Thus, it is possible to increase the bonding strength between the base 120 and the lid 130 by the brazing material 180.

The constituent material of the metalized layer is not particularly limited as long as it is a material capable of increasing the adhesion with the brazing material 180. Examples of the constituent material include a single body of a metal element such as gold (Au), platinum (Pt), aluminum (Al), silver (Ag), chromium (Cr), nickel (Ni), copper (Cu), molybdenum (Mo), niobium (Nb), tungsten (W), iron (Fe), titanium (Ti), cobalt (Co), zinc (Zn), or zirconium (Zr), or an alloy or compound including the metal elements.

The lid 130 includes a plate-shaped base portion 133 and a frame-shaped side wall 134 which is provided under the base portion 133, and thus the concave portion 131 mentioned above is formed. The lid 130 is formed by processing, for example, a flat metal plate into a box shape.

The constituent material of the lid 130 is not particularly limited, and may be, for example, a ceramic material or a glass material. However, alloys such as an Fe—Ni—Co based alloy, e.g., Kovar and an Fe—Ni based alloy, e.g., 42 alloy are preferably used.

In addition, a frame-shaped metalized layer, not shown in the drawing, is provided under the side wall 134 of the lid 130 when necessary. The metalized layer is used to increase adhesion between the lid 130 and the brazing material 180 to be described later. The constituent material of the metalized layer includes, for example, the metal materials described above as the constituent materials of the connection electrodes 141 and 151 and the like.

A method of bonding the lid 130 to the base 120 is not particularly limited, and includes, for example, a method of allowing the brazing material 180 to penetrate between the lid 130 and the base 120 by irradiating an edge portion of the lid 130 with a laser in a state where the lid 130 is mounted on the base 120 and by heating and melting the brazing material 180.

The constituent material of the brazing material 180 is not particularly limited. For example, gold solder, silver solder, and the like can be used as the constituent material, but silver solder is preferably used. In addition, a melting point of the brazing material 180 is not particularly limited, but is preferably, for example, equal to or higher than 800° C. and equal to or lower than 1000° C.

The vibrator element 190 mentioned above is accommodated in the accommodation space S of the package 110. The vibrator element 190 accommodated in the accommodation space S is cantilevered by the base 120 through a pair of conductivity adhesives 161 and 162.

The conductivity adhesive 161 is provided so as to come into contact with the connection electrode 141 and the bonding pad 193b, thereby electrically connecting the connection electrode 141 and the bonding pad 193b. Similarly, the conductivity adhesive 162 is provided so as to come into contact with the connection electrode 151 and the bonding pad 195b, thereby electrically connecting the connection electrode 151 and the bonding pad 195b. That is, the conductivity adhesives 161 and 162 function as a part of the electric wiring which is formed within the package 110.

Meanwhile, the conductivity adhesives 161 and 162 can be replaced with a conductive metal material. The conductive metal material is not particularly limited, but includes the metal materials mentioned above as the constituent materials of the connection electrodes 141 and 151 and the like.

In addition, the conductivity adhesives 161 and 162 can be replaced with, for example, a bonding wire.

Here, the through electric wirings 143 and 153 and the insulating region 125 will be described in detail. Meanwhile, the configurations of the through electric wiring 143 and the through electric wiring 153 are the same as each other, and thus only the through electric wiring 143 will be described below and a description of the through electric wiring 153 will be omitted here.

Figure 4:
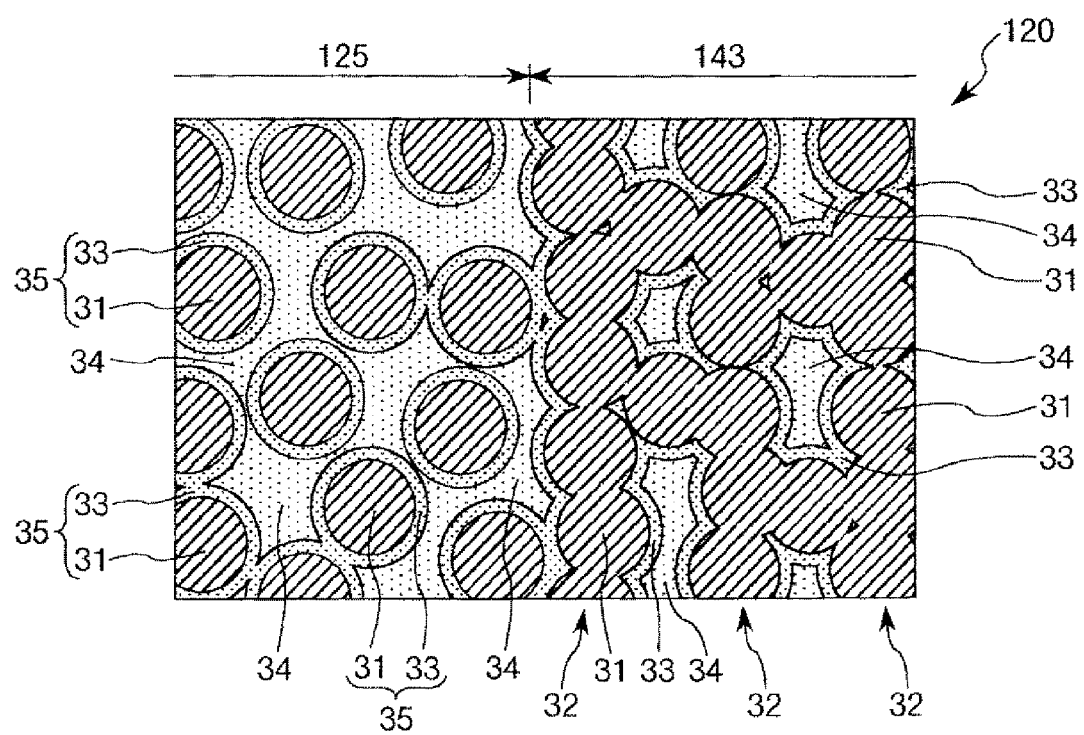
FIG. 4 is an enlarged view of a portion X of a base (electric wiring layer according to an embodiment of the invention) which is included in the vibrator shown in FIG. 2.
Figure 5:
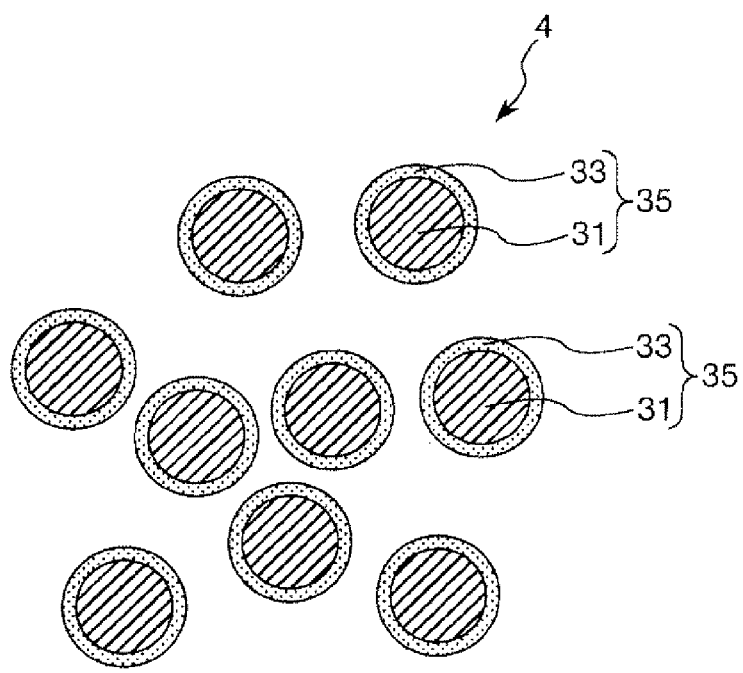
FIG. 5 is a cross-sectional view illustrating a method of manufacturing the vibrator shown in FIG. 1 which includes a method of manufacturing an electric wiring layer according to an embodiment of the invention.

FIG. 4 is an enlarged view of a portion X of a base (electric wiring layer according to an embodiment of the invention) which is included in the vibrator shown in FIG. 2.

The portion X of FIG. 2 is set so as to straddle the through electric wiring 143 and the insulating region 125 which is adjacent thereto. Here, as shown in FIG. 4, the through electric wiring 143 includes a particle-coupled body 32 formed by coupling the metal particles 31 to each other, a surface insulating layer 33 provided so as to cover (located on) the surface of the particle-coupled body 32, and an interparticle insulating portion 34 provided so as to fill a gap between the particle-coupled body 32 and the surface insulating layer 33.

As shown in FIG. 4, in the through electric wiring 143, the particle-coupled body 32 formed by coupling the metal particles 31 having conductivity in the form of a three-dimensional network is constructed. For this reason, the through electric wiring 143 has substantially uniform conductivity in the entirety thereof and functions as an electric wiring which passes through the base 120 in the thickness direction thereof.

On the other hand, the insulating region 125 includes a metal particle with an insulating layer 35 which is constituted by the metal particle 31 and the surface insulating layer 33 provided so as to cover the surface of the metal particle. The interparticle insulating portion 34 is provided between the metal particles with an insulating layer 35. The metal particles with an insulating layer 35 are fixed by the interparticle insulating portion 34, and thus the mechanical strength of the insulating region 125 is secured. The insulating region 125 functions as an insulator that insulates the through electric wiring 143 and the through electric wiring 153 from each other.

The through electric wiring 143 mentioned above is a portion which is formed by irradiating a structure similar to the insulating region 125 with energy rays and coupling the metal particles 31 in the structure. In other words, the region of the through electric wiring 143 before being subjected to the irradiation with energy rays has the same configuration as that of the insulating region 125, and the region is irradiated with energy rays, and thus it is possible to convert a desired region to the through electric wiring 143. In addition, the insulating region 125 is constituted by a pressed-powder molded body formed by pressurizing and molding a mixed powder including the metal particles with an insulating layer 35. Therefore, such a pressed-powder molded body is irradiated with energy rays, and thus the through electric wiring 143 and the insulating region 125 are obtained.

The metal particle 31 is a particle of a metal material having conductivity. Examples of the constituent material of the metal particle 31 include a single body of a metal element such as gold (Au), platinum (Pt), aluminum (Al), silver (Ag), chromium (Cr), nickel (Ni), copper (Cu), molybdenum (Mo), niobium (Nb), tungsten (W), iron (Fe), titanium (Ti), cobalt (Co), zinc (Zn), or zirconium (Zr), or an alloy or complex including the metal elements.

In addition, a Vickers hardness of the metal particle 31 is preferably equal to or higher than 30 and equal to or less than 500, and is more preferably equal to or higher than 50 and equal to or less than 400. When the Vickers hardness of the metal particle 31 is within the above-mentioned range, the metal particle 31 can be moderately deformed by being pressed from the adjacent metal particle 31 and the like when the pressed-powder molded body is formed as described above. For this reason, a filling rate of the pressed-powder molded body is increased, and adhesion between the metal particles with an insulating layer 35 is increased without damaging the surface insulating layer 33 in association with the deformation of the metal particle 31, and thus the shape retention as a molded body is also increased. As a result, it is possible to increase the mechanical strength of the base 120 (electric wiring layer) and to easily couple the metal particles 31 by the irradiation with energy rays, and thus it is possible to increase the conductivity of the through electric wiring 143.

The Vickers hardness of the metal particle 31 is measured based on a test method specified in JIS Z 2244.

The particle-coupled body 32 is formed by coupling the metal particles 31. The coupling between the metal particles 31 is performed by sintering based on the irradiation with energy rays. In the sintering, materials mutually move between the metal particles 31, and the metal particles 31 are finally coupled to each other in the form of a three-dimensional network, thereby forming the particle-coupled body 32.

On the other hand, in the coupling between the metal particles 31, the surface insulating layer 33 covering the metal particle 31 is displaced in association with the movement of the material constituting the metal particle 31, and thus is distributed so as to cover the particle-coupled body 32. In addition, a portion of the surface insulating layer 33 remains within the particle-coupled body 32.

Further, the interparticle insulating portion 34 is displaced in association with the movement of the material constituting the metal particle 31, and thus may be moved to the outside of the particle-coupled body 32, but a portion thereof remains within the particle-coupled body 32.

As a result, as shown in FIG. 4, the through electric wiring 143 including the particle-coupled body 32, the surface insulating layer 33, and the interparticle insulating portion 34 is obtained.

The through electric wiring 143 obtained in this manner has conductivity which is the same as or comparable with that of a bulk body of the constituent material of the metal particle 31. Thus, the vibrator 1 achieves both excellent frequency characteristics and low power consumption.

The surface insulating layer 33 may be provided so as to cover (located on) at least a portion of the surface of the metal particle 31, but it is preferable that the surface insulating layer be provided so as to cover the entire surface of the metal particle 31. The metal particle with an insulating layer 35 is obtained by providing the surface insulating layer 33. In the metal particle with an insulating layer 35, the surface insulating layer 33 is interposed between the metal particles 31 having conductivity, and thus the metal particles with an insulating layer 35 are insulated from each other.

The constituent material of the surface insulating layer 33 includes various types of glass materials mainly containing, for example, $B_2O_3$, $SiO_2$, $Al_2O_3$, $Bi_2O_3$, ZnO, SnO, or $P_2O_5$. In addition to these materials, the glass material may include a sub-component such as PbO, $Li_2O$, $Na_2O$, $K_2O$, MgO, CaO, SrO, BaO, $Gd_2O_3$, $Y_2O_3$, $La_2O_3$, or $Yb_2O_3$.

More specifically, examples of the constituent material of the surface insulating layer 33 include various types of glass materials such as soda lime glass, borosilicate glass, lead glass, aluminosilicate glass, borate glass, phosphate glass, sulfate glass, or vanadate glass.

The above-mentioned glass materials have excellent chemical stability and insulation properties as compared with an organic material, and thus the surface insulating layer 33 capable of maintaining high insulation properties over a long period of time is obtained.

Among the glass materials, a glass material having a softening point of equal to or lower than 650° C. is preferably used, a glass material having a softening point of equal to or higher than 100° C. and equal to or lower than 600° C. is more preferably used, and a glass material having a softening point of equal to or higher than 300° C. and equal to or lower than 500° C. is further preferably used. The glass material is selected so that the softening point thereof falls within the above-mentioned range, and thus the glass material melted when being irradiated with energy rays has sufficient flowability. For this reason, there is a tendency for the metal particles 31 to be coupled to each other, and thus the through electric wiring 143 having high conductivity is obtained.

Meanwhile, the softening point of the glass material is measured by a method of measuring a softening point which is specified in JIS R 3103-1.

In addition, examples of the glass material constituting the surface insulating layer 33 particularly include SnO—$P_2O_5$—MgO, SnO—$P_2O_5$, $Bi_2O_3$—$B_2O_3$—ZnO, $Bi_2O_3$—ZnO—$B_2O_3$, $SiO_2$—$Al_2O_3$—$B_2O_3$, $SiO_2$—$B_2O_3$—$Al_2O_3$, $SiO_2$—$B_2O_3$—ZnO, $Bi_2O_3$—$B_2O_3$, and ZnO—$B_2O_3$—$SiO_2$.

In addition, a non-conductive inorganic material, such as a ceramic material or a silicon material, may be added to the glass material constituting the surface insulating layer 33 to such an extent that characteristics of the glass material are not damaged. In this case, the amount of the material added is set to, for example, approximately equal to or less than 10 mass %.

An average thickness of the surface insulating layer 33 is not particularly limited, but is preferably equal to or higher than approximately 0.1% and equal to or less than approximately 5% of an average particle size of the metal particle 31 and is more preferably equal to or higher than approximately 0.3% and equal to or less than approximately 3%. The thickness of the surface insulating layer 33 is set to be in the range with respect to the metal particle 31, and thus it is possible to sufficiently absorb irregularities of the surface of the metal particle 31 by the surface insulating layer 33. Thereby, the metal particle with an insulating layer 35 can secure a sufficient insulation property even when the metal particles with an insulating layer come into contact with each other.

More specifically, the average thickness of the surface insulating layer 33 is preferably equal to or larger than 50 nm and equal to or smaller than 3000 nm and is more preferably equal to or larger than 100 nm and equal to or smaller than 2000 nm. The average thickness of the surface insulating layer 33 is set to be in the range, and thus it is possible to prevent electrical conduction between the metal particles 31 from being allowed and to prevent an insulation property of the insulating region 125 from being decreased even when the metal particles with an insulating layer 35 come into contact with each other in the insulating region 125.

Meanwhile, when the average thickness of the surface insulating layer 33 is smaller than the lower limit and when, for example, the insulating region 125 is pressurized, there is a concern that the metal particle 31 may pass through the surface insulating layer 33 and electrical conduction between the metal particles 31 may be allowed, depending on the particle size and constituent material of the metal particle 31. On the other hand, when the average thickness of the surface insulating layer 33 is larger than the upper limit and the metal particles 31 attempt to be coupled to each other, the probability of the surface insulating layer 33 hindering the coupling becomes higher depending on the particle size and constituent material of the metal particle 31. For this reason, there is a concern of a decrease in the efficiency for forming the through electric wiring 143, such as the need of a higher amount of energy for sintering.

The average thickness of the surface insulating layer 33 is an average value of thicknesses of the surface insulating layers 33 in ten points which are obtained by observing the cross-section of one metal particle with an insulating layer 35 using a microscope and by setting substantially equal intervals between ten surface insulating layers. Meanwhile, when the particle size and the amount of the metal particles 31 used at the time of manufacturing the metal particle with an insulating layer 35 and the amount of the surface insulating layer 33 used are known, it is also possible to derive the average thickness of the surface insulating layer 33 from these pieces of information through calculation.

The interparticle insulating portion 34 is interposed between the metal particles with an insulating layer 35 in the insulating region 125 and also partially remains within the through electric wiring 143. The interparticle insulating portion 34 fixes the metal particle with an insulating layer 35 in the insulating region 125, thereby securing the mechanical strength of the insulating region 125. For this reason, the insulating region 125 has the mechanical strength required as the base 120.

Any inorganic insulating material such as a glass material, a ceramic material, or a silicon material may be used as the constituent material of the interparticle insulating portion 34, but a glass material is preferably used.

In addition, the composition of the glass material constituting the interparticle insulating portion 34 and the composition of the glass material constituting the surface insulating layer 33 may be different from each other, but it is preferable that the glass materials have the same composition. The composition of the glass material constituting the interparticle insulating portion 34 is the same as the composition of the glass material constituting the surface insulating layer 33. Thus, when the metal particles 31 are coupled to each other by sintering, the surface insulating layer 33 and the interparticle insulating portion 34 are softened at the same softening point and may be mixed with each other. Therefore, the coupling between the metal particles 31 is not likely to be hindered by the glass material. For this reason, the metal particles 31 are smoothly and evenly coupled to each other, and thus it is possible to form the through electric wiring 143 with high conductivity.

In addition, when irradiation with energy rays is performed, there is a tendency for a boundary (threshold value) between an energy amount that reaches the coupling between the metal particles 31 and an energy amount that does not reach the coupling to become distinct. For this reason, when a region where the through electric wiring 143 is to be formed is irradiated with energy rays, there is a tendency for a boundary between the through electric wiring 143 and the insulating region 125 to become distinct. Therefore, it is possible to form the through electric wiring 143 with high definition when seen in a plan view.

In addition, since the insulating region 125 has an insulation property and includes the metal particles 31, the insulating region has high thermal conductivity derived from a metal material. Moreover, the surface insulating layer 33 and the interparticle insulating portion 34 mainly contain a glass material, and thus have high thermal conductivity as compared with a resin material. Therefore, the base 120 has high thermal conductivity. Even when an element serving as a heat source is mounted on the base 120, the base 120 contributes to the suppression of an increase in the temperature of an element because of its excellent heat radiation, and thus it is possible to achieve a long lifespan and high performance of the element.

In addition, both the surface insulating layer 33 and the interparticle insulating portion 34 mainly contain a glass material (substantially, a resin material is not contained), and thus have high heat resistance and low gas adsorption (gas emission). For this reason, the base 120 has heat resistance capable of withstanding, for example, soldering work and solder reflow processing. In addition, even when the accommodation space S (sealed space) accommodating the vibrator element 190 in the package 110 is decompressed, the discharge of a gas from the surface insulating layer 33 and the interparticle insulating portion 34 is suppressed. Thus, it is possible to suppress an increase in pressure and the contamination of the inside of the accommodation space S due to the discharged gas.

In addition, a non-conductive inorganic material, such as a ceramic material or a silicon material, may be added to the glass material constituting the interparticle insulating portion 34 to such an extent that characteristics of the glass material are not damaged. In this case, the amount of the material added is set to, for example, approximately equal to or less than 10 mass %.

Meanwhile, even when the composition of the glass material constituting the interparticle insulating portion 34 is different from the composition of the glass material constituting the surface insulating layer 33, a difference between the softening points of the glass materials is preferably equal to or lower than 100° C. and is more preferably equal to or lower than 50° C. The difference between the softening points of the glass materials is set to be in the range. Thus, when the metal particles 31 are coupled to each other by sintering, the glass materials are not likely to hinder the coupling between the metal particles 31. For this reason, it is possible to form the through electric wiring 143 having high conductivity and high precision when seen in a plan view.

In addition, thermal expansion coefficients of the glass materials are preferably equal to or larger than $2 \times 10^{-6}$ [/° C.] and equal to or less than $15 \times 10^{-6}$ [/° C.], and a thermal expansion coefficient of the constituent material of the metal particle 31 is preferably equal to or larger than $4 \times 10^{-6}$ [/° C.] and equal to or less than $20 \times 10^{-6}$ [/° C.]. The materials are selected so that the thermal expansion coefficients of the glass materials and the metal material fall within the above-mentioned ranges. Thus, even when the temperature of the base 120 changes, a gap is not likely to be generated between the metal particle 31, and the surface insulating layer 33 or the interparticle insulating portion 34. Thereby, it is possible to suppress a decrease in the airtightness of the package 110 due to the temperature change.

Meanwhile, the thermal expansion coefficient is within a temperature range of 30° C. to 300° C.

Up to now, a description has been given of the base 120 to which the electric wiring layer according to the embodiment of the invention is applied and the package 110 including the base. However, the electric wiring board according to the embodiment of the invention is not limited thereto, and the invention can also be applied to, for example, an electric circuit layer and an interposer substrate for mounting an active element such as an IC and an LSI and a passive element such as a resistor, a capacitor, and a coil.

In addition, the base 120 according to this embodiment has airtightness in the thickness direction thereof. Since the interparticle insulating portion 34 formed of an inorganic material is filled between the metal particles with an insulating layer 35, the gas permeability of the base 120 is sufficiently low.

A leakage amount of the base 120 in the thickness direction is preferably equal to or smaller than $1 \times 10^{-4}$ Pa·m³/s and is more preferably equal to or smaller than $1 \times 10^{-8}$ Pa·m³/s. The base 120, having such a leakage amount, which is used for the package 110 of the vibrator 1 has a sufficient airtightness.

Meanwhile, the leakage amount is measured by a leakage detector (vacuum process). At this time, a helium gas is used as a measurement gas.

Method of Manufacturing Vibrator and Method of Manufacturing Electric Wiring Layer Next, a method of manufacturing a vibrator and a method of manufacturing an electric wiring layer included therein according to the invention will be described.

FIGS. 5 to 9 are cross-sectional views illustrating a method of manufacturing the vibrator shown in FIG. 1 which includes a method of manufacturing an electric wiring layer according to an embodiment of the invention.

The method of manufacturing a vibrator shown in FIGS. 5 to 9 includes [1] a process of obtaining a pressed powder molded layer 41 by pressurizing and molding a powder 4 including the metal particles with an insulating layer 35 and [2] a process of irradiating the pressed powder molded layer 41 with energy rays and forming the through electric wirings 143 and 153 in the irradiation region. Hereinafter, the processes will be sequentially described.

1. Molding Process 1-1. First, an aggregate of the metal particles with an insulating layer 35 (powder of the metal particles with an insulating layer 35) is mixed with a glass material for forming the interparticle insulating portion 34 to thereby prepare the powder 4. The metal particle with an insulating layer 35 is formed by attaching the glass material to the surface of the metal particle 31. Examples of a method of attaching the glass material include a wet method, such as a method of applying a liquid containing a glass powder to the metal particle 31 or a method of granulating the metal particle 31 while spraying a liquid containing a glass powder, a dry method such as a method of fixing a glass material to the surface of the metal particle 31, and the like. Among the methods, a method of mechanically fixing a glass material to the surface of the metal particle 31 is preferably used. Such a method can be performed under drying, and can also be performed in an inert gas when necessary. For this reason, there is less concern that moisture and the like may enter a space between the metal particle 31 and the surface insulating layer 33, and thus it is possible to suppress the degeneration and deterioration of the metal particle 31 over a long period of time. In addition, the glass material is mechanically attached. Thus, even when foreign substances, an oxide film, or the like are attached to the surface of the metal particle 31, it is possible to form the surface insulating layer 33 while removing or destroying the attached substances. For this reason, the metal particle 31 covered with the surface insulating layer has a high level of cleanliness, and thus the particle-coupled body 32 formed by coupling the metal particles 31 has high conductivity.

In addition, according to this method, it is possible to form a glass material, which is difficult to handle due to its high softening point, into a film as the surface insulating layer 33. For this reason, this method is useful in that a wide variety of glass materials can be used.

A method of mechanically fixing a glass material to the surface of the metal particle 31 includes a method of using an apparatus generating a mechanical compression action and a friction action on, for example, a mixed powder of the metal particle 31 and a glass powder. Examples of such an apparatus include various types of mills such as a hammer mill, a disk mill, a roller mill, a ball mill, a planetary mill, and a jet mill, various types of friction mixers such as an angmill (registered trademark), a high-speed oval mixer, a mix muller (registered trademark), a Jacobson mill, a mechano-fusion (registered trademark), and a hybridization (registered trademark), and the like. In these apparatuses, it is considered that a glass powder is pressed to the surface of the metal particle 31 to thereby fuse the surfaces of particles to each other. As a result, the metal particle with an insulating layer 35 formed by fixing a glass material to the surface of the metal particle 31 is obtained.

Meanwhile, in the following description, a glass material used in order to form the metal particle with an insulating layer 35 is referred to as a "first glass material" and a powder of the first glass material is referred to as a "first glass powder". In addition, a glass material for forming the interparticle insulating portion 34 is referred to as a "second glass material" and a powder of the second glass material is referred to as a "second glass powder".

An average particle size of the metal particle 31 is not particularly limited, but is preferably equal to or larger than approximately 0.5 μm and equal to or smaller than approximately 30 μm and is more preferably equal to or larger than approximately 1 μm and equal to or smaller than approximately 20 μm. The average particle size of the metal particle 31 is set to be in the range, and thus it is possible to achieve both high conductivity of the through electric wiring 143 and high position accuracy (definition) of the through electric wiring 143. Meanwhile, when the average particle size of the metal particle 31 is smaller than the lower limit, there is a concern that a volume decrease rate at the time of coupling the metal particles 31, though depending on a constituent material of the metal particle 31, may be relatively increased. For this reason, there is a concern that the position accuracy of the through electric wiring 143 may be decreased or there may be a tendency for a space to be easily formed therein. In addition, since a sufficient compression action and friction action do not occur due to the excessively small size of the metal particle 31, there is a concern that the manufacturing efficiency of the metal particle with an insulating layer 35 may be decreased. On the other hand, when the average particle size of the metal particle 31 is larger than the upper limit and when, for example, the through electric wiring 143 having a narrow line width is to be formed, the line width cannot be made sufficiently small, and thus there is a concern that it may be difficult to achieve the high density of the through electric wiring 143. In addition, there is a concern that the surface insulating layer 33 may be likely to be peeled off due to the excessively large size of the metal particle 31.

Meanwhile, the average particle size of the metal particle 31 is obtained as a particle size when an accumulated amount from a small diameter side on a mass basis is set to be 50% in particle size distribution acquired by a laser diffraction particle size distribution measuring apparatus.

In addition, when the average particle size of the metal particle 31 is within the above-mentioned range, a maximum particle size of the metal particle 31 is preferably equal to or smaller than 200 μm and is more preferably equal to or smaller than 150 μm. The maximum particle size of the metal particle 31 is set to be in the range, and thus the metal particle 31 is not likely to be separated from the surface insulating layer 33 while increasing the definition of the through electric wiring 143. Therefore, it is possible to secure a sufficient insulation property of the insulating region 125.

Meanwhile, the maximum particle size of the metal particle 31 is obtained as a particle size when an accumulated amount from a small diameter side on a mass basis is set to be 99.9% in particle size distribution acquired by a laser diffraction particle size distribution measuring apparatus.

The first glass powder used in this method may have an average particle size which is larger than the average particle size of the metal particle 31, but an average particle size smaller than the average particle size of the metal particle is preferably used. Specifically, the average particle size of the first glass powder is preferably equal to or larger than 1% and equal to or smaller than 60% and is more preferably equal to or larger than 10% and equal to or smaller than 50% of the average particle size of the metal particle 31. A ratio of the average particle size of the first glass powder with respect to the average particle size of the metal particle 31 is set to be within the above-mentioned range, and thus the above-mentioned compression action and friction action sufficiently occur on the first glass powder. For this reason, it is possible to evenly and uniformly fix the first glass powder to the surface of the metal particle 31.

Meanwhile, the average particle size of the first glass powder is obtained as a particle size when an accumulated amount from a small diameter side on a mass basis is set to be 50% in particle size distribution acquired by a laser diffraction particle size distribution measuring apparatus.

In addition, the amount of the first glass powder used to manufacture the metal particle with an insulating layer 35 is appropriately set on the basis of a relationship between the particle size of the metal particle 31 and the thickness of the surface insulating layer 33 in the metal particle with an insulating layer 35 to be formed.

In addition, the metal particle 31 may be manufactured by any method. Examples of the manufacturing method include various types of powdering methods such as an atomization method (for example, a water atomization method, a gas atomization method, and a high speed rotation water flow atomization method), a reduction method, a carbonyl method, and a grinding method.

Among the methods, a metal particle manufactured by an atomization method is preferably used, and a metal particle manufactured by a water atomization method or a high speed rotation water flow atomization method is more preferably used. The atomization method is a method of manufacturing a metal powder by causing a molten metal to collide with a fluid (liquid or gas) which is sprayed at a high speed to thereby micronize and cool the molten metal. The metal particle 31 is manufactured by the atomization method, and thus it is possible to efficiently manufacture an extremely minute powder. In addition, the shape of the obtained powder particle approaches a spherical shape by the action of surface tension. For this reason, a powder having a high filling rate at the time of molding is obtained. That is, the base 120 according to this embodiment achieves both high mechanical strength and high conductivity.

Meanwhile, when a water atomization method is used as the atomization method, pressure of water (hereinafter, referred to as "atomized water") which is sprayed toward the molten metal is not particularly limited, but is preferably equal to or higher than approximately 75 MPa and equal to or lower than approximately 120 MPa (equal to or higher than 750 kgf/cm$^2$ and equal to or lower than 1200 kgf/cm$^2$) and is more preferably equal to or higher than approximately 90 MPa and equal to or lower than approximately 120 MPa (equal to or higher than 900 kgf/cm$^2$ and equal to or lower than 1200 kgf/cm$^2$).

In addition, the temperature of the atomized water is not particularly limited, but is preferably equal to or higher than approximately 1° C. and equal to or lower than approximately 20° C.

Further, the atomized water has a vertex on a falling path of the molten metal and is often sprayed in the form of a cone in which the outer diameter thereof gradually decreases downwards. In this case, a vertical angle θ of the cone formed by the atomized water is preferably equal to or larger than approximately 10° and equal to or smaller than approximately 40° and is more preferably equal to or larger than approximately 15° and equal to or smaller than approximately 35°. In addition, according to the water atomization method (particularly, high speed rotation water flow atomization method), it is possible to cool the molten metal at a particularly high speed. For this reason, a high-quality powder is obtained in a wide alloy composition.

In addition, a cooling speed at the time of cooling the molten metal in the atomization method is preferably equal to or higher than $1\times10^{4}$° C./s and is more preferably equal to or higher than $1\times10^{5}$° C./s.

Meanwhile, classification may be performed on the metal particle 31, which is obtained in this manner, when necessary. Examples of a classification method include a dry classification such as a screening classification, an inertial classification, or a centrifugal classification, a wet classification such as a sedimentation classification, and the like.

In addition, the metal particle with an insulating layer 35 manufactured may be granulated when necessary. Examples of a granulating method include a spray drying method, a rolling granulation method, a fluidized granulation method, a tumbling fluidized granulation method, a stirring mixing granulation method, an extrusion granulation method, a crushing granulation method, a compression granulation method, and the like.

On the other hand, the average particle size of the second glass powder mixed with the metal particle with an insulating layer 35 in the powder 4 is not particularly limited, but is preferably smaller than that of the metal particle 31. Specifically, the average particle size of the second glass powder is preferably equal to or higher than 1% and equal to or lower than 60% of the average particle size of the metal particle 31 and is more preferably equal to or higher than 10% and equal to or lower than 50%. The proportion of the average particle size of the second glass powder with respect to the average particle size of the metal particle 31 is set to be within the above-mentioned range, and thus it is possible to obtain the pressed powder molded layer 41 having excellent shape retention.

Meanwhile, the average particle size of the second glass powder is obtained as a particle size when an accumulated amount from a small diameter side on a mass basis is set to be 50% in particle size distribution acquired by a laser diffraction particle size distribution measuring apparatus.

The amount of the second glass powder mixed in the powder 4 is appropriately set in accordance with a ratio between the amount of metal particles with an insulating layer 35 and the amount of the interparticle insulating portion 34 in the base 120 to be formed. Specifically, when the sum of the volume of the metal particle with an insulating layer 35 and the volume of the second glass powder in the powder 4 is set to 100, the volume of the second glass powder mixed in the powder 4 is preferably larger than 0 and equal to or smaller than 65, is more preferably equal to or larger than 5 and equal to or smaller than 50, and is further preferably equal to or larger than 10 and equal to or smaller than 40. The volume of the second glass powder is set to be within the above-mentioned range, and thus it is possible to further increase the mechanical strength of the base 120 while achieving both conductivity in the through electric wirings 143 and 153 and an insulation property in the insulating region 125.

Meanwhile, when the sum of the volume of the metal particle with an insulating layer 35 and the volume of the second glass powder in the powder 4 is set to 100, a case where the volume of the second glass powder mixed in the powder 4 is 0 is equivalent to a second embodiment to be described later.

1-2. Subsequently, the prepared powder 4 is molded while being pressurized. The molding is performed using, for example, a press forming machine 5 as shown in FIGS. 6A and 6B.

Figure 6A:
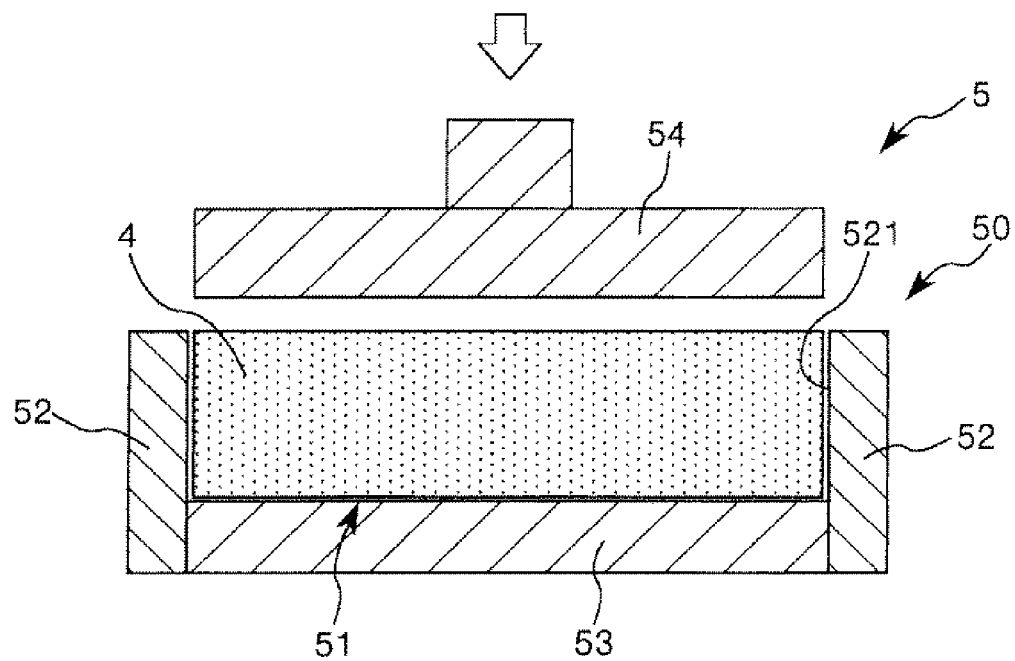
FIGS. 6A and 6B are cross-sectional views illustrating a method of manufacturing the vibrator shown in FIG. 1 which includes a method of manufacturing an electric wiring layer according to an embodiment of the invention.
Figure 6B:
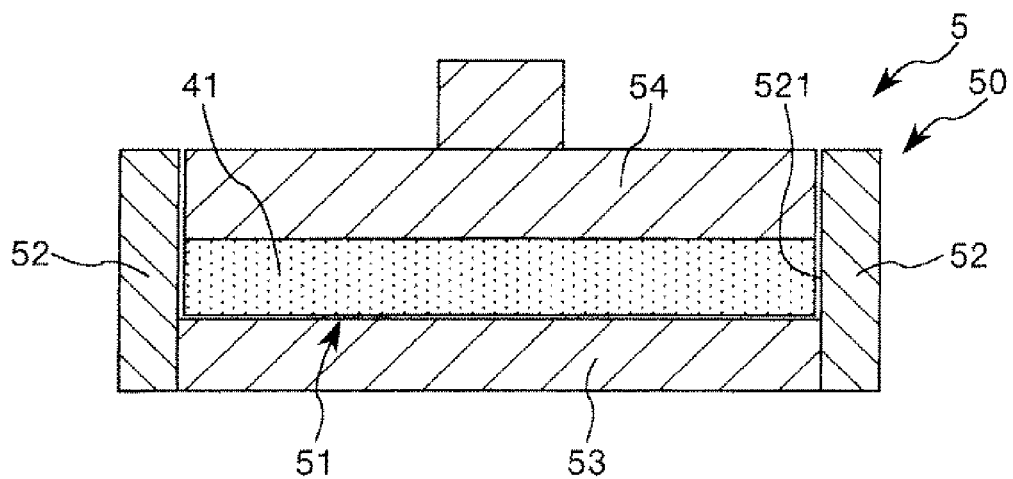

The press forming machine 5 shown in FIGS. 6A and 6B includes a forming die 50 including a cavity 51. The forming die 50 includes a die 52 including a through hole 521 which vertically passes therethrough, a lower punch 53 which is provided under the die 52 and is configured to be capable of blocking a lower surface of the through hole 521, and an upper punch 54 which is provided on the opposite side to the lower punch 53 of the through hole 521 and is configured to be capable of blocking an upper surface of the through hole 521. A space surrounded by the die 52, the lower punch 53, and the upper punch 54 is the cavity 51.

In the press forming machine 5, the lower punch 53 and the upper punch 54 are configured to be capable of relatively moving with respect to the die 52. Thereby, the volume of the cavity 51 changes in accordance with the movement of the lower punch 53 and the upper punch 54, and thus it is possible to take a mold closing state, shown in FIG. 6B, where the volume is minimized and a mold opening state, shown in FIG. 6A, where the cavity 51 is opened.

In the molding of the powder 4, first, the forming die 50 is set to be in a mold opening state, and the powder 4 is filled in the cavity 51. At this time, the volume of the powder 4 filled in the cavity 51 is appropriately set, and thus it is possible to adjust the thickness of the base 120 which is finally obtained.

Figure 7A:
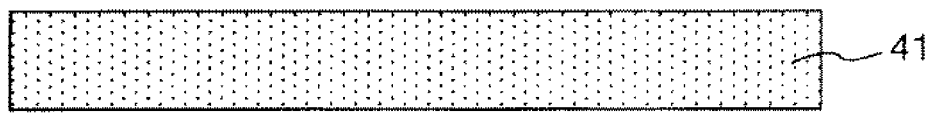
FIGS. 7A to 7C are cross-sectional views illustrating a method of manufacturing the vibrator shown in FIG. 1 which includes a method of manufacturing an electric wiring layer according to an embodiment of the invention.
Figure 7B:
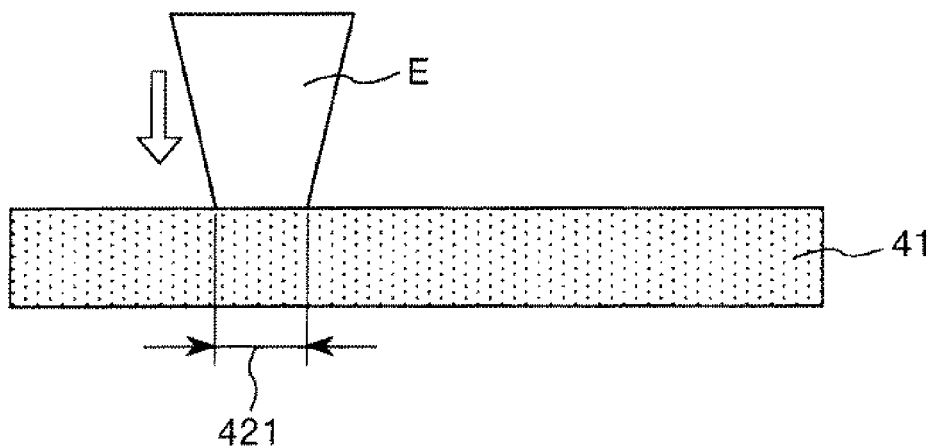

Subsequently, the upper punch 54 is lowered to mold the powder 4 within the cavity 51 while pressurizing the powder. Thereby, the powder 4 is molded into a plate shape, and thus the pressed powder molded layer 41 shown in FIG. 7A is obtained.

At this time, a molding pressure is not particularly limited, but is preferably equal to or higher than approximately 10 MPa and equal to or lower than approximately 3000 MPa (0.1 t/cm$^2$ to 30 t/cm$^2$).

In addition, the thickness of the pressed powder molded layer 41 obtained is not particularly limited, but is preferably equal to or larger than approximately 0.1 mm and equal to or smaller than approximately 30 mm and is more preferably equal to or larger than approximately 0.3 mm and equal to or smaller than approximately 15 mm.

After the pressurization and molding, the obtained pressed powder molded layer 41 is heated. Thereby, the second glass material is melted and is then solidified, and thus the metal particles with an insulating layer 35 are fixed to each other in the insulating region 125. As a result, the mechanical strength of the pressed powder molded layer 41 is secured. Meanwhile, when a melting point of the second glass material is low and the metal particles with an insulating layer 35 are fixed to each other by the temperature, frictional heat, and the like at the time of pressurization and molding, the heating may be omitted.

At this time, a heating temperature is set to be equal to or higher than a softening point of the second glass material. Specifically, it is preferable that the heating be performed at a temperature higher by 5° C. or more than the softening point of the second glass material, and it is more preferable that the heating be performed at a temperature higher by 10° C. or more than the softening point of the second glass material. In addition, a heating time is appropriately set in accordance with the thickness and size of the pressed powder molded layer 41, a heating temperature, and the like. The heating time is not particularly limited, but is set to, for example, equal to or longer than approximately five minutes and equal to or shorter than approximately two hours.

In addition, a heating atmosphere is not particularly limited, and may be an oxidized gas atmosphere, a reducing gas atmosphere, or the like. However, considering the degeneration and deterioration of the metal particle 31 and the surface insulating layer 33, the heating atmosphere is preferably an inert gas atmosphere, such as a nitrogen gas or an argon gas, or a decompressed atmosphere. In particular, the heating atmosphere is more preferably an inert gas atmosphere.

In addition, when the softening point of the first glass material is higher than the softening point of the second glass material, the heating temperature may be set to be equal to or higher than the softening point of the first glass material or may be set to be lower than the softening point. When the heating temperature is set to be equal to or higher than the softening point of the first glass material, coupling efficiency between the metal particles 31 is increased. Thus, it is possible to form the through electric wirings 143 and 153 in a shorter period of time and to increase conductivity. On the other hand, when the heating temperature is set to be lower than the softening point of the first glass material, it is possible to maintain a state where the surface insulating layer 33 is fixed to the surface of the metal particle 31 in the insulating region 125. For this reason, even when heating is performed in this process, it is possible to secure an insulation property in the insulating region 125.

Further, the heating temperature is preferably lower than a sintering temperature of the metal particle 31. Thereby, the metal particles 31 are coupled to each other unintentionally in this process, and thus it is possible to prevent coupling between the metal particles 31 using the irradiation with energy rays E to be described later from being hindered.

Meanwhile, the sintering temperature of the metal particle 31 is set to be lower by 10% than a melting point of the constituent material of the metal particle 31.

The pressed powder molded layer 41 obtained in this manner exerts high conductivity by the irradiation with energy rays to be described later and thus is capable of forming an electric wiring, and is equivalent to the member for forming an electric wiring layer according to an embodiment of the invention. In other words, the pressed powder molded layer 41 has an electric wiring forming capability which is capable of forming an electric wiring having a desired pattern only by irradiating an arbitrary region with energy rays.

Meanwhile, the shape of the pressed powder molded layer 41 is not limited to the above-mentioned plate shape, and may be any shape such as a block shape or a spherical shape.

Figure 7C:
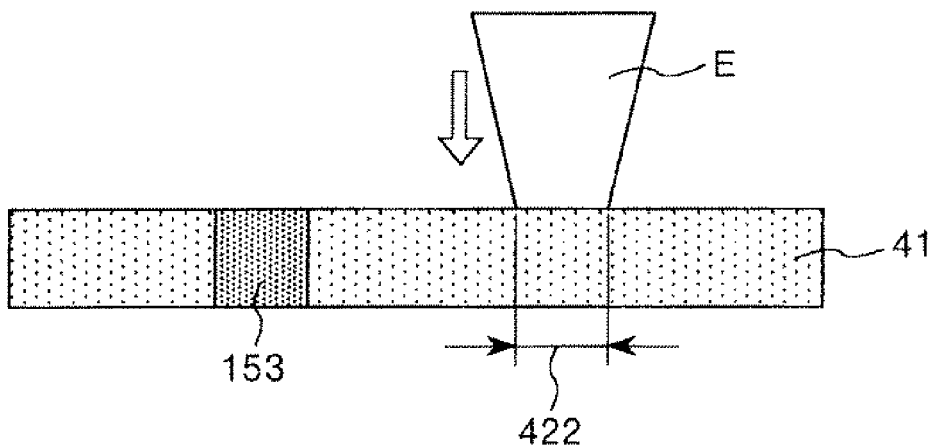

2. Wiring Forming Process 2-1. Next, a region 421 where the through electric wiring 153 is to be formed in the obtained pressed powder molded layer 41 is irradiated with the energy rays E (see FIG. 7B). Thereby, the metal particles 31 which are present in the region 421 of the pressed powder molded layer 41 are coupled to each other, and thus the particle-coupled body 32 is formed. As a result, the region 421 is given conductivity, and thus the through electric wiring 153 shown in FIG. 7C is formed.

Figure 8A:
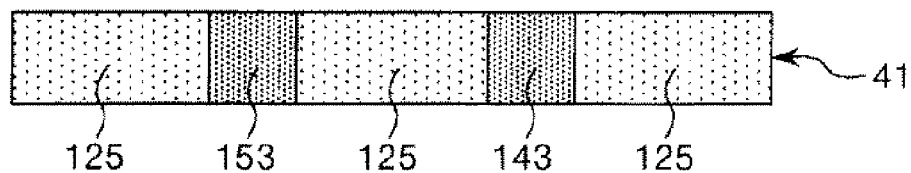
FIGS. 8A to 8C are cross-sectional views illustrating a method of manufacturing the vibrator shown in FIG. 1 which includes a method of manufacturing an electric wiring layer according to an embodiment of the invention.

Subsequently, a region 422 where the through electric wiring 143 is to be formed is irradiated with the energy rays E (see FIG. 7C). Thereby, the region 422 is also given conductivity, and thus the through electric wiring 143 shown in FIG. 8A is formed.

Examples of the energy rays E include a lamp light, a laser, radiation, an electron beam, an ion beam, and the like, and a laser is particularly preferably used. Since the laser has high directivity, it is possible to selectively apply energy to a desired region without using a mask or the like. For this reason, it is possible to further increase the manufacturing efficiency of the base 120. When energy rays, other than a laser, which have low directivity are used, irradiation may be performed using a mask.

A wavelength of the energy rays E is not particularly limited, but is preferably equal to or larger than approximately 100 nm and equal to or smaller than approximately 1300 nm and is more preferably equal to or larger than approximately 300 nm and equal to or smaller than approximately 1200 nm. The wavelength of the energy rays E is set to be within the above-mentioned range, and thus the energy absorptivity of the pressed powder molded layer 41 is increased, thereby allowing the through electric wirings 143 and 153 to be efficiently formed.

In addition, when the energy rays E is a laser, for example, an excimer laser, a carbon dioxide laser, a YAG laser, or a $YVO_4$ laser is used as the laser.

In this manner, the base 120 having the through electric wirings 143 and 153 and the insulating region 125 formed therein is obtained. Since the through electric wirings 143 and 153 and the insulating region 125 are formed by reforming a portion of one pressed powder molded layer 41, it can be said that the wirings and the region are integrally formed. For this reason, the insulating region 125 and the through electric wirings 143 and 153 are firmly connected to each other, and thus mechanical strength in a boundary between the insulating region and the through electric wirings is sufficiently increased, thereby allowing the occurrence of a problem such as the peeling-off of the through electric wirings 143 and 153 to be suppressed. Therefore, it is possible to manufacture the vibrator 1 having high reliability. In addition, the through electric wirings 143 and 153 in the base 120 are easily formed at a small pitch, and thus it is possible to achieve the miniaturization and cost reduction of the vibrator 1.

Further, in the following process, the base 120 is provided with the connection electrodes 141 and 151 and the external mounting electrodes 142 and 152.

Figure 8B:
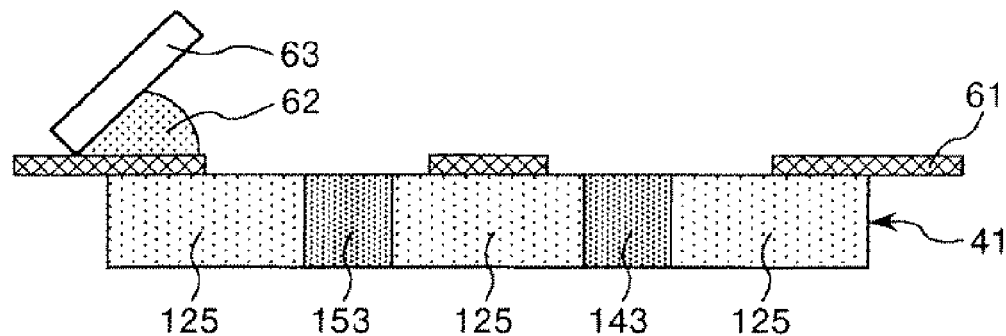

2-2. First, as shown in FIG. 8B, a mask 61 is disposed on the pressed powder molded layer 41. The mask 61 is a stencil mask having a window portion corresponding to a region where the connection electrodes 141 and 151 are formed in a process to be described later.

Next, as shown in FIG. 8B, a conductive paste 62 is placed on the mask 61, and the conductive paste 62 is spread using a squeegee 63. Thereby, the film of the conductive paste 62 is formed on the through electric wirings 143 and 153.

The conductive paste 62 is a liquid composition containing a powder of a conductive material, an organic binder, and a dispersion medium that dissolves or disperses the powder and the organic binder. In the conductive paste 62, the dispersion medium volatilizes and the organic binder is removed by a baking process to be described later, and thus a conductive film is formed.

Figure 8C:
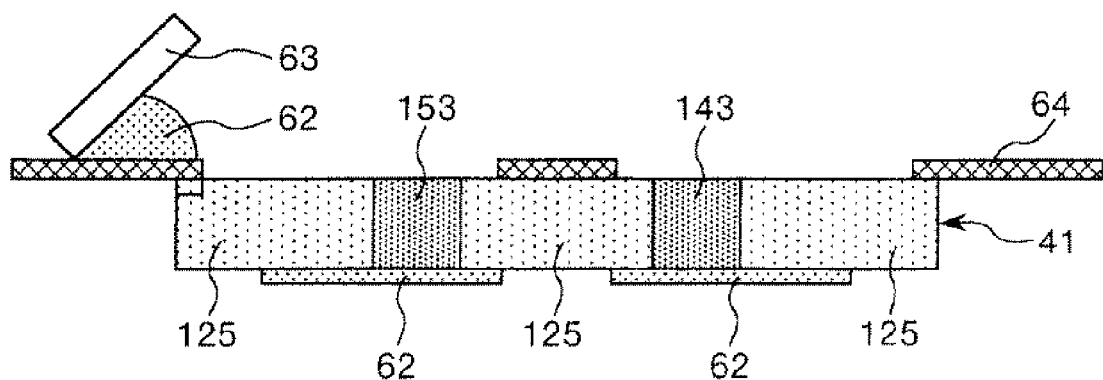

Next, the front and back sides of the pressed powder molded layer 41 are inverted, and another mask 64 is disposed to spread the conductive paste 62 as shown in FIG. 8C. Thereby, the film of the conductive paste 62 is formed on the through electric wirings 143 and 153.

Figure 9A:
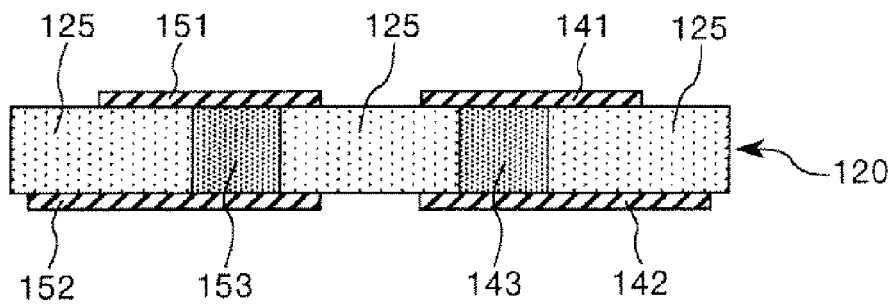
FIGS. 9A to 9C are cross-sectional views illustrating a method of manufacturing the vibrator shown in FIG. 1 which includes a method of manufacturing an electric wiring layer according to an embodiment of the invention.

Thereafter, the pressed powder molded layer 41 having the film of the conductive paste 62 formed therein is baked. Thereby, the organic binder and the dispersion medium in the conductive paste 62 are removed, and the conductive material in the conductive paste 62 is sintered. Thus, as shown in FIG. 9A, the connection electrodes 141 and 151 and the external mounting electrodes 142 and 152 are formed.

Meanwhile, the baking is performed at a temperature which is lower than both the softening points of the first glass material and the second glass material. Therefore, a conductive paste having a sintering temperature lower than the softening points of the glass materials is selected as the conductive paste 62.

Figure 9B:
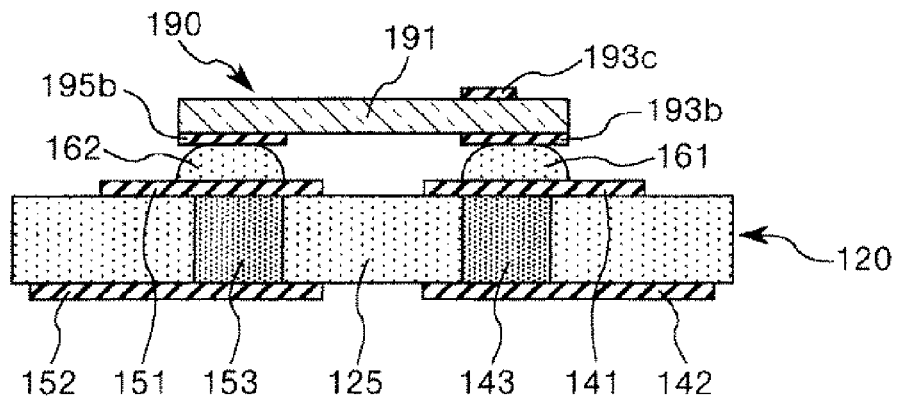

2-3. Next, the conductivity adhesives 161 and 162 are placed on the connection electrodes 141 and 151. Subsequently, as shown in FIG. 9B, the vibrator element 190 is placed on the conductivity adhesives 161 and 162.

Next, a metallization layer not shown in the drawing is formed on the base 120. Similarly, a metallization layer not shown in the drawing is also formed on a lower end face of the side wall 134 of the lid 130. Meanwhile, the metallization layers may be formed before this process. In addition, the metallization layer may be provided when necessary, and may be omitted when the constituent material of the lid 130 is a metal material.

Figure 9C:
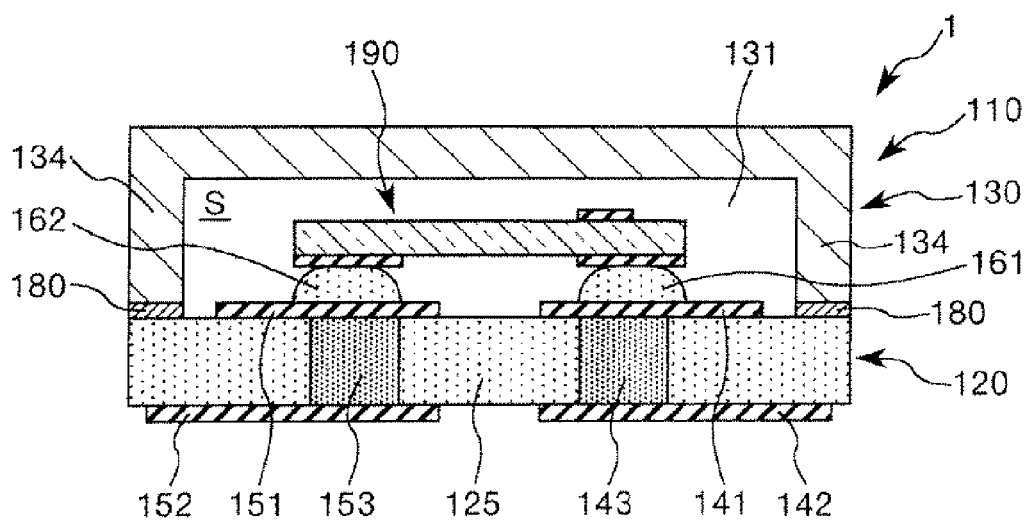

Next, the lid 130 is disposed on the base 120, and the base 120 and the lid 130 are brazed through the brazing material 180. Thereby, the inside of the concave portion 131 of the lid 130 is sealed and is isolated from the outside. Thereby, the vibrator 1 shown in FIG. 9C is obtained. At this time, a work environment is filled with an inert gas or is placed under reduced pressure, and thus it is possible to maintain the accommodation space S in a state where an inert gas is filled or a decompressed state. As a result, it is possible to suppress the deterioration over time of the vibrator element 190.

As described above, the vibrator 1 manufactured in this manner includes the through electric wirings 143 and 153 having high conductivity, and thus both excellent frequency characteristics and low power consumption are achieved.

Second Embodiment

Next, an electric wiring layer according to a second embodiment of the invention will be described.

Figure 10:
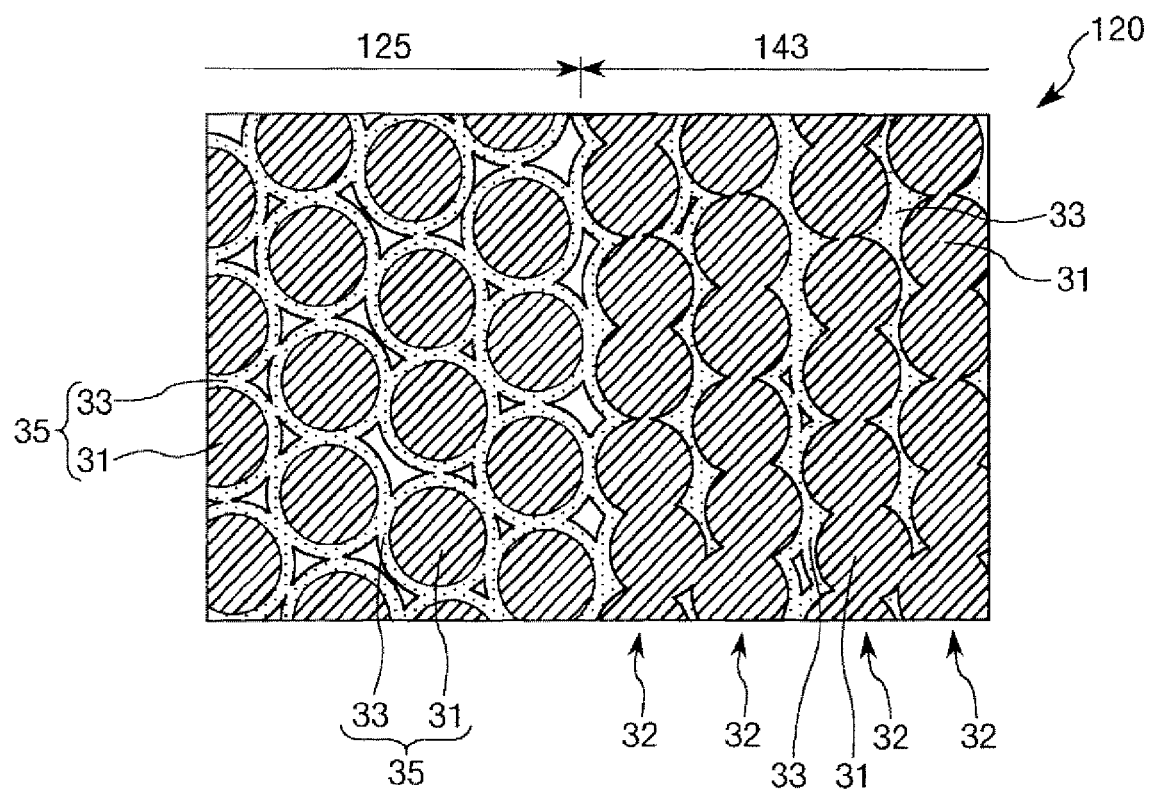
FIG. 10 is a partially enlarged view of a base to which an electric wiring layer according to a second embodiment of the invention is applied.

FIG. 10 is a partially enlarged view of a base to which the electric wiring layer according to the second embodiment of the invention is applied.

Hereinafter, the second embodiment will be described. However, a description will be given below focusing on the differences from the first embodiment described above, and the description of the same matters will be omitted. In the drawings, the same components as those in the above-described embodiment will be denoted by the same reference numerals.

The second embodiment is the same as the first embodiment except that an interparticle insulating portion 34 is omitted.

That is, a through electric wiring 143 shown in FIG. 10 includes a particle-coupled body 32 formed by coupling metal particles 31 and a surface insulating layer 33 which is provided so as to cover the surface of the particle-coupled body 32.

Therefore, in the through electric wiring 143, the metal particles 31 are fixed by the coupling therebetween, and thus the mechanical strength of the through electric wiring 143 is secured.

On the other hand, in an insulating region 125 shown in FIG. 10, the surface insulating layers 33 of metal particles with an insulating layer 35 are fused to each other. Thereby, the metal particles with an insulating layer 35 are fixed to each other, and thus the mechanical strength of the insulating region 125 is secured.

Accordingly, in the manufacture of a base 120 according to this embodiment, it is preferable that a pressed powder molded layer be heated at a temperature at which a first glass material is melted. Thereby, it is possible to secure the mechanical strength of the base 120.

Also in the base 120, the through electric wiring 143 having high conductivity is obtained. In addition, the proportion of the metal particle 31 per unit volume increases by the amount of omission of the interparticle insulating portion 34. For this reason, it is possible to further increase the conductivity of the through electric wiring 143. In addition, as the proportion of the metal particle 31 becomes higher, the "resolution" of a boundary between a region where the metal particles 31 are coupled to each other and a region where the metal particles are not coupled to each other is increased when irradiation with energy rays is performed. Therefore, for example, it is possible to easily form the through electric wiring 143 having a smaller line width when seen in a plan view.

In addition, similarly to the first embodiment, the surface insulating layer 33 mainly contains a glass material, and thus has a sufficient airtightness in the thickness direction thereof.

In addition, the base 120 according to this embodiment exhibits the same operations and effects as those of the base 120 according to the first embodiment.

Third Embodiment

Next, an electric wiring layer according to a third embodiment of the invention will be described.

Figure 11:
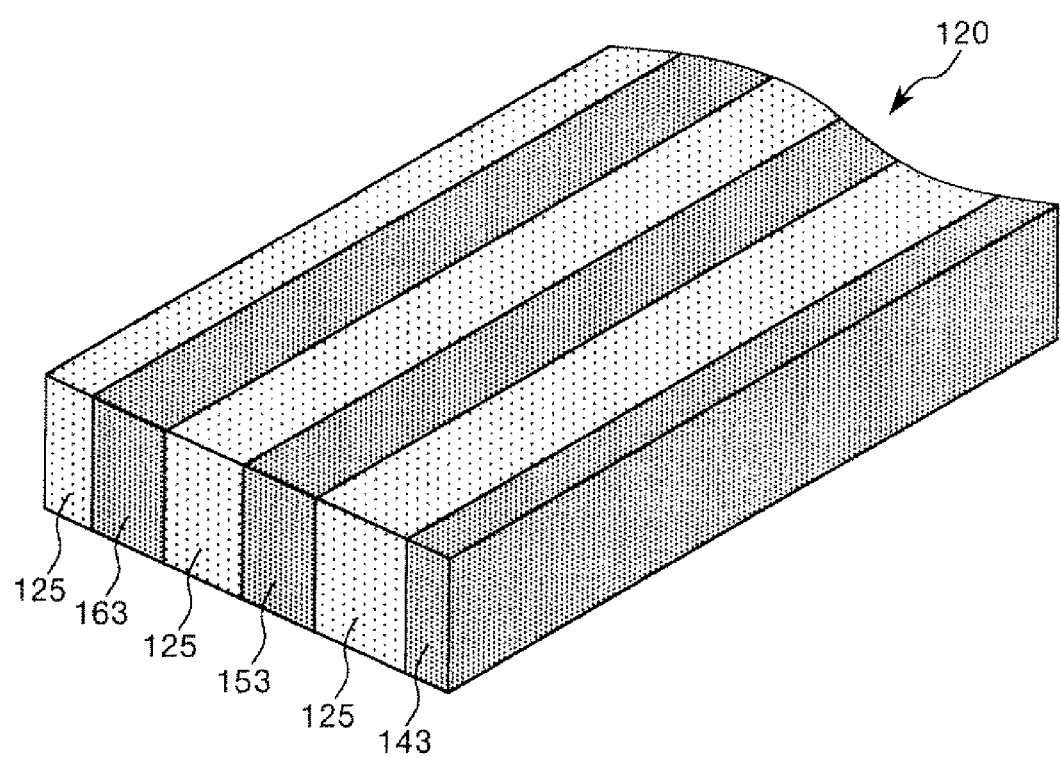
FIG. 11 is a perspective view showing an electric wiring layer according to a third embodiment of the invention.
Figure 12:
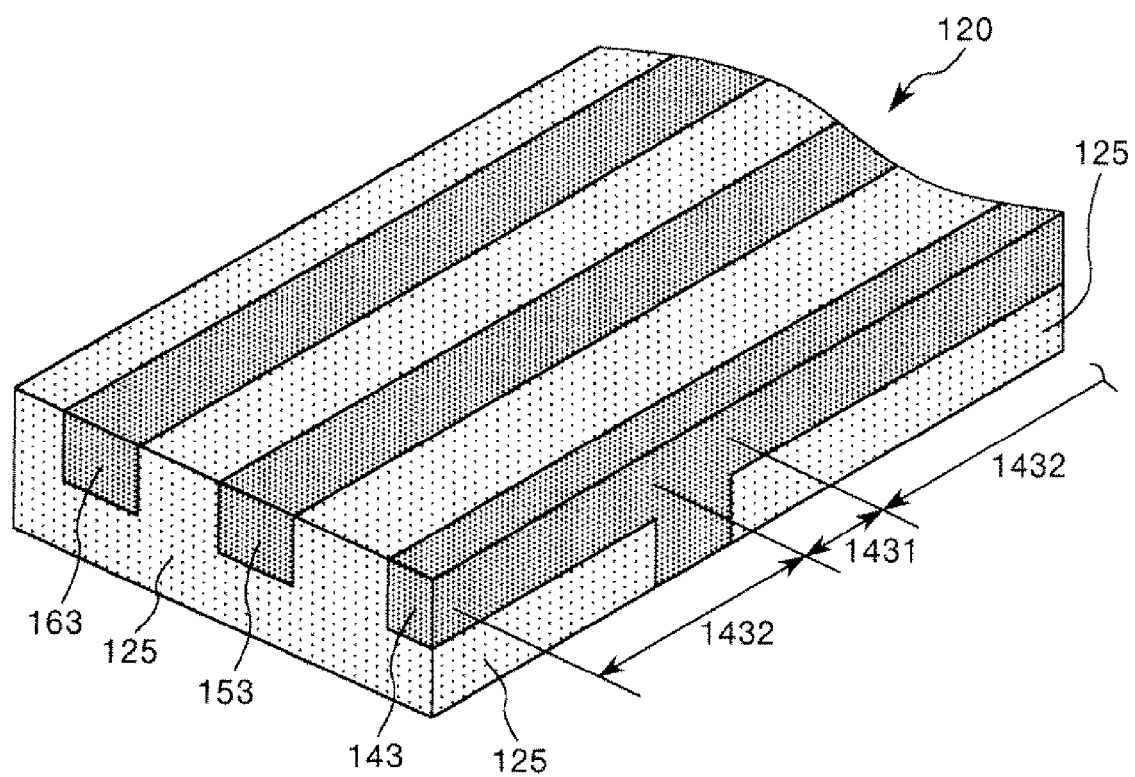
FIG. 12 is a perspective view showing the electric wiring layer according to the third embodiment of the invention.

FIGS. 11 and 12 are perspective views of the electric wiring layer according to the third embodiment of the invention.

Hereinafter, the third embodiment will be described. However, a description will be given below focusing on the differences from the first and second embodiments described above, and the description of the same matters will be omitted. In the drawings, the same components as those in the above-described embodiments will be denoted by the same reference numerals.

The third embodiment is the same as the first embodiment except that shapes of through electric wirings 143, 153, and 163 when seen in a plan view in a base 120 are different.

The through electric wirings 143, 153, and 163 shown in FIG. 11 linearly extend along the longitudinal direction of the base 120 and are parallel to each other along a direction perpendicular to the longitudinal direction. Each of the through electric wirings 143, 153, and 163 can electrically connect two electric wirings separated from each other in the longitudinal direction.

In order to form the through electric wirings 143, 153, and 163, a region where the wirings are to be formed in a pressed powder molded layer 41 may be linearly scanned with energy rays E. A scanning route is appropriately selected, and thus it is possible to easily manufacture the through electric wirings 143, 153, and 163 having a desired pattern.

Meanwhile, the base 120 is placed on another insulating substrate, and the insulating substrate having the base placed thereon can be used as an electric wiring board.

In addition, the through electric wirings 143, 153, and 163 shown in FIG. 12 are the same as the through electric wirings 143, 153, and 163 shown in FIG. 11 except for a configuration in which a portion thereof in the longitudinal direction passes through the base 120 and other portions do not pass therethrough.

For convenience of illustration, FIG. 12 shows that only the through electric wiring 143 includes a through portion 1431 and a non-through portion 1432. The through portion 1431 and the non-through portion 1432 can be formed by differentiating irradiation energy for each area when the pressed powder molded layer 41 is irradiated with the energy rays E.

Specifically, when the through portion 1431 is formed, the irradiation energy is adjusted so that the progress of coupling between the metal particles 31 reaches the back side of the pressed powder molded layer 41. On the other hand, when the non-through portion 1432 is formed, the irradiation energy is adjusted so that the progress of coupling between the metal particles 31 is stopped in the middle of the pressed powder molded layer 41 in the thickness direction.

Also in this embodiment, the same operations and effects as those in the first and second embodiments are obtained.

Electric Wiring Board

Next, an electric wiring board according to an embodiment of the invention will be described.

Figure 13:
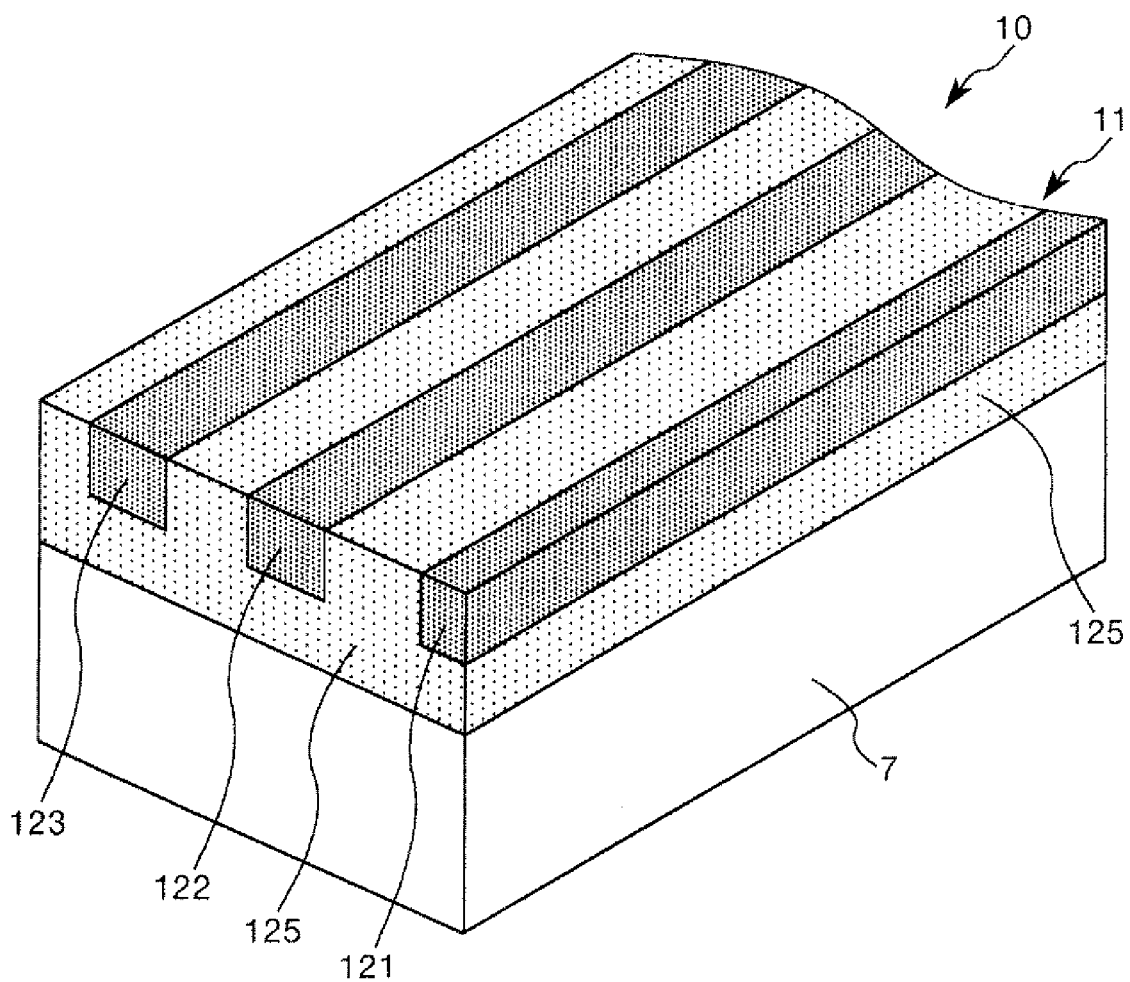
FIG. 13 is a perspective view showing an electric wiring board according to an embodiment of the invention.
Figure 14:
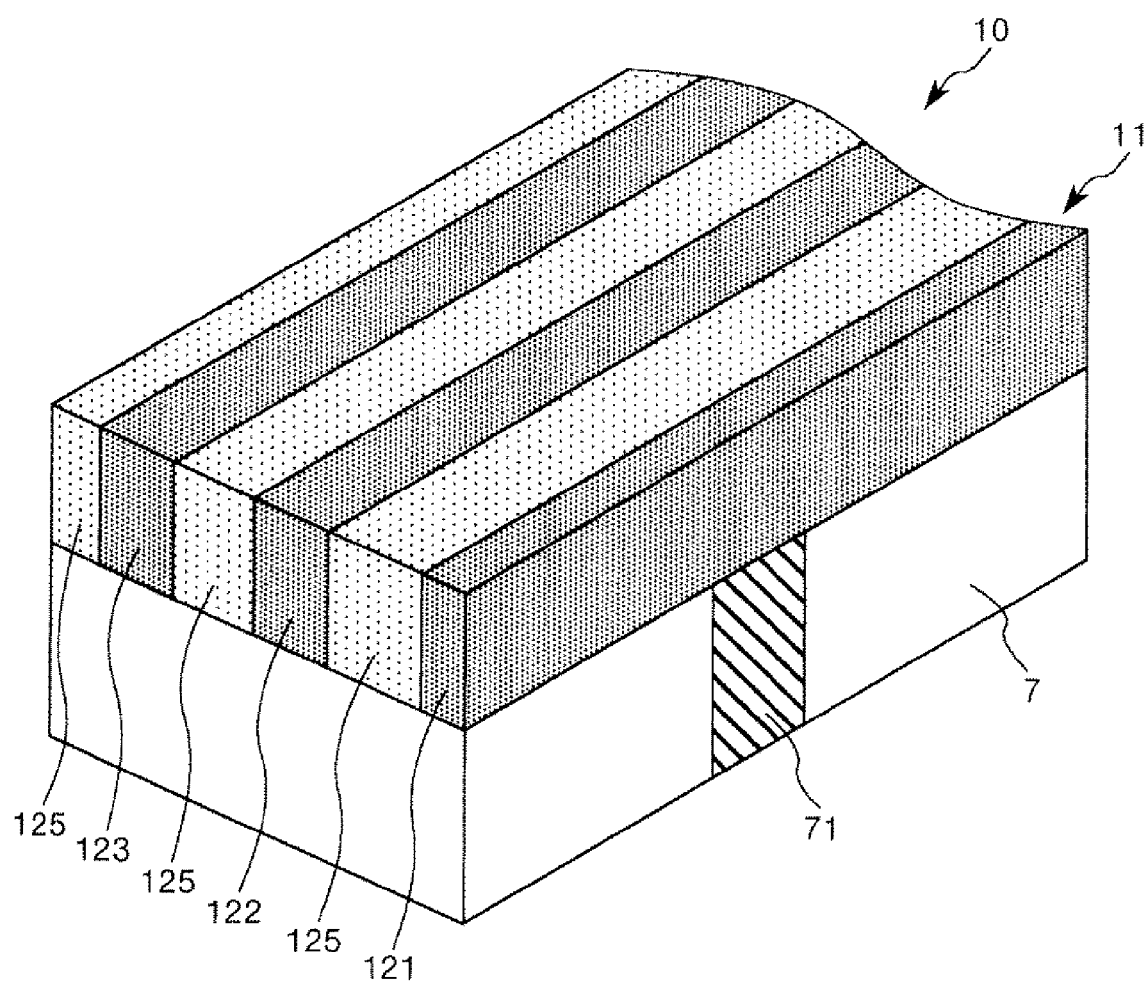
FIG. 14 is a perspective view showing an electric wiring board according to an embodiment of the invention.

FIGS. 13 and 14 are perspective views of an electric wiring board according to an embodiment of the invention.

An electric wiring board 10 shown in FIG. 13 includes an insulating substrate 7 and an electric wiring layer 11 which is provided on one surface thereof. The electric wiring board 10 is equivalent to an electric wiring board according to an embodiment of the invention, and the electric wiring layer 11 is equivalent to an electric wiring layer according to an embodiment of the invention.

Hereinafter, an electric wiring board according to this embodiment will be described. However, a description will be given below focusing on the differences from the electric wiring layer according to the above-described embodiments, and the description of the same matters will be omitted. In the drawings, the same components as those in the above-described embodiments will be denoted by the same reference numerals.

The electric wiring layer 11 has a long shape. The electric wiring layer 11 is provided with electric wirings 121, 122, and 123 and an insulating region 125 which is buried between the electric wirings 121, 122, and 123. Here, the electric wiring layer 11 has the same configuration as the base 120 according to the above-described embodiments, and the electric wirings 121, 122, and 123 have the same configurations as the through electric wirings 143, 153, and 163 according to the above-described embodiments.

The electric wirings 121, 122, and 123 linearly extend along the longitudinal direction of the electric wiring layer 11 and are parallel to each other along a direction perpendicular to the longitudinal direction. Each of the electric wirings 121, 122, and 123 can electrically connect two electric wirings separated from each other in the longitudinal direction.

In the electric wiring board 10, the insulating substrate 7 and the electric wiring layer 11 are fused to each other. Thereby, the electric wiring board 10 has excellent mechanical strength.

The constituent material of the insulating substrate 7 is not particularly limited, and may be a resin material. However, the insulating substrate is preferably formed of a ceramic material or a glass material. Thereby, the electric wiring board 10 having high heat resistance and low gas adsorption (gas emission) is obtained. In addition, all of these materials contain a component capable of constituting glass, and thus it is possible to bond the insulating substrate 7 and the electric wiring layer 11 to each other with a high level of strength by the above-mentioned fusion.

Here, examples of the ceramic material include various ceramics, for example, oxide-based ceramics such as alumina, silica, titania, and zirconia, nitride-based ceramics such as silicon nitride, aluminum nitride, and titanium nitride, and carbide-based ceramics such as silicon carbide.

In addition, the above-mentioned materials are used as the glass material.

In the electric wiring board 10, the electric wiring layer 11 is supported by the insulating substrate 7. For this reason, even when the thickness of the electric wiring layer 11 is reduced, the mechanical strength of the entire electric wiring board 10 can be secured.

The thickness of the insulating substrate 7 is appropriately set based on the thickness of the electric wiring layer 11, but is preferably equal to or larger than approximately 20 µm and equal to or smaller than approximately 3000 µm.

In addition, it is possible to obtain a laminated electric wiring board by laminating a plurality of the obtained electric wiring boards 10.

The electric wiring board 10 shown in FIG. 14 is the same as the electric wiring board 10 shown in FIG. 13 except that the electric wirings 121, 122, and 123 pass through the electric wiring layer 11 in the thickness direction thereof and that a through electric wiring 71 is formed in the insulating substrate 7.

That is, the electric wirings 121, 122, and 123 shown in FIG. 14 are configured to pass through the electric wiring layer 11 in the thickness direction thereof. In addition, the insulating substrate 7 is provided with the through electric wiring 71 in accordance with the positions of the electric wirings 121, 122, and 123. Thereby, the electric wiring board 10 has a conductive path between one principal surface and the other principal surface.

The through electric wiring 71 is formed of a conductive material buried in the insulating substrate 7. For example, the conductive material is appropriately selected from the same constituent materials of the metal particle 31 mentioned above.

Electrical connection between layers is enabled by using the electric wiring board 10 as shown in FIG. 14, thereby making it suitable for the manufacture of a laminated electric wiring board.

In this manner, the electric wiring board 10 including the insulating substrate 7 and the electric wiring layer 11, which is provided with the electric wirings 121, 122, and 123 and the insulating region 125, is obtained. Since the electric wirings 121, 122, and 123 and the insulating region 125 in the electric wiring layer 11 are formed by reforming a portion of one pressed powder molded layer 41, it can be said that the wirings and the region are integrally formed. For this reason, the insulating region 125 and the electric wirings 121, 122, and 123 are firmly connected to each other, and thus mechanical strength in a boundary between the insulating region and the electric wirings is sufficiently increased, thereby allowing the occurrence of a problem such as the peeling-off of the electric wirings 121, 122, and 123 to be suppressed.

Method of Manufacturing Electric Wiring Board

Next, a method of manufacturing an electric wiring board according to an embodiment of the invention will be described.

Figure 15A:
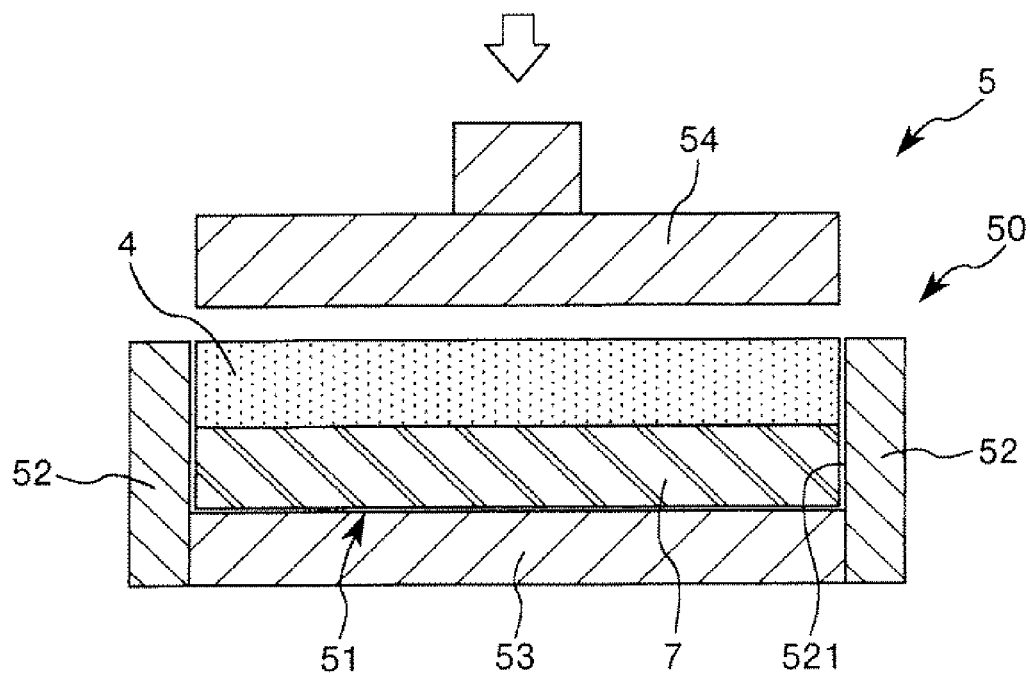
FIGS. 15A and 15B are cross-sectional views showing a method of manufacturing an electric wiring board according to an embodiment of the invention.
Figure 15B:
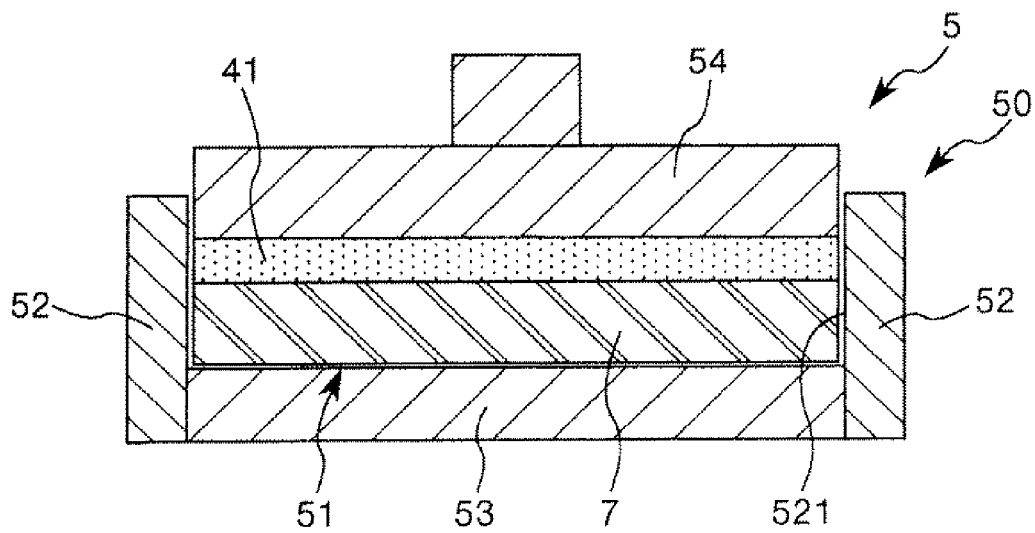

FIGS. 15A and 15B are cross-sectional views showing a method of manufacturing an electric wiring board according to an embodiment of the invention.

A method of manufacturing an electric wiring board according to this embodiment is the same as that in the first embodiment except that an insulating substrate is disposed within a cavity of a press forming machine.

Hereinafter, a method of manufacturing an electric wiring board according to this embodiment will be described. However, a description will be given below focusing on the differences from the method of manufacturing an electric wiring layer according to the above-described embodiments, and the description of the same matters will be omitted. In the drawings, the same components as those in the above-described embodiments will be denoted by the same reference numerals.

In this embodiment, first, as shown in FIG. 15A, an insulating substrate 7 is disposed within a cavity 51. Thereby, as shown in FIG. 15B, a pressed powder molded layer 41 attached to the insulating substrate 7 is obtained.

After mold release, when the pressed powder molded layer 41 attached to the insulating substrate 7 is heated, metal particles with an insulating layer 35 in the pressed powder molded layer 41 are fixed to each other, and the insulating substrate 7 and the pressed powder molded layer 41 are fused to each other. For example, the fusion is performed by fusing a glass material contained in the insulating substrate 7 and a glass material contained in the electric wiring layer 11 to each other and solidifying the materials.

Thereafter, similarly to the above-described embodiments, the pressed powder molded layer 41 is irradiated with energy rays, and thus electric wirings 121, 122, and 123 are formed.

That is, the pressed powder molded layer 41 attached to the insulating substrate 7 exerts conductivity by irradiation with energy rays and thus is capable of forming an electric wiring, and is equivalent to the member for forming an electric wiring board according to an embodiment of the invention. In other words, the pressed powder molded layer 41 attached to the insulating substrate 7 has an electric wiring forming capability which is capable of forming an electric wiring having a desired pattern only by irradiating an arbitrary region with energy rays.

Electronic Apparatus

Subsequently, an electronic apparatus (electronic apparatus according to the invention) which includes the electric wiring layer according to the invention will be described in detail with reference to FIGS. 16 to 18.

Figure 16:
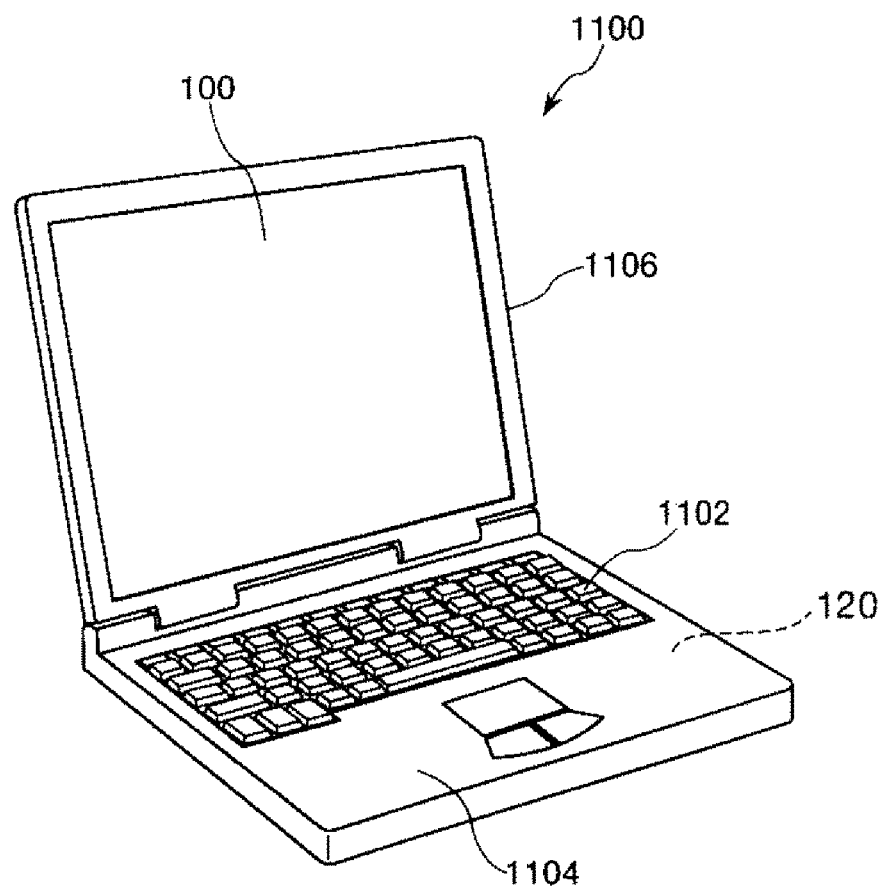
FIG. 16 is a perspective view showing the configuration of a mobile (or notebook) personal computer to which an electronic apparatus including an electric wiring layer of an embodiment of the invention is applied.

FIG. 16 is a perspective view showing the configuration of a mobile (or notebook) personal computer to which an electronic apparatus including the electric wiring layer according to the invention is applied. In the diagram, a personal computer 1100 is configured to include a main body 1104 having a keyboard 1102 and a display unit 1106 having a display portion 100, and the display unit 1106 is supported so as to be rotatable with respect to the main body 1104 through a hinge structure. The base 120 (electric wiring layer) having an electric circuit formed therein is provided in the personal computer 1100.

Figure 17:
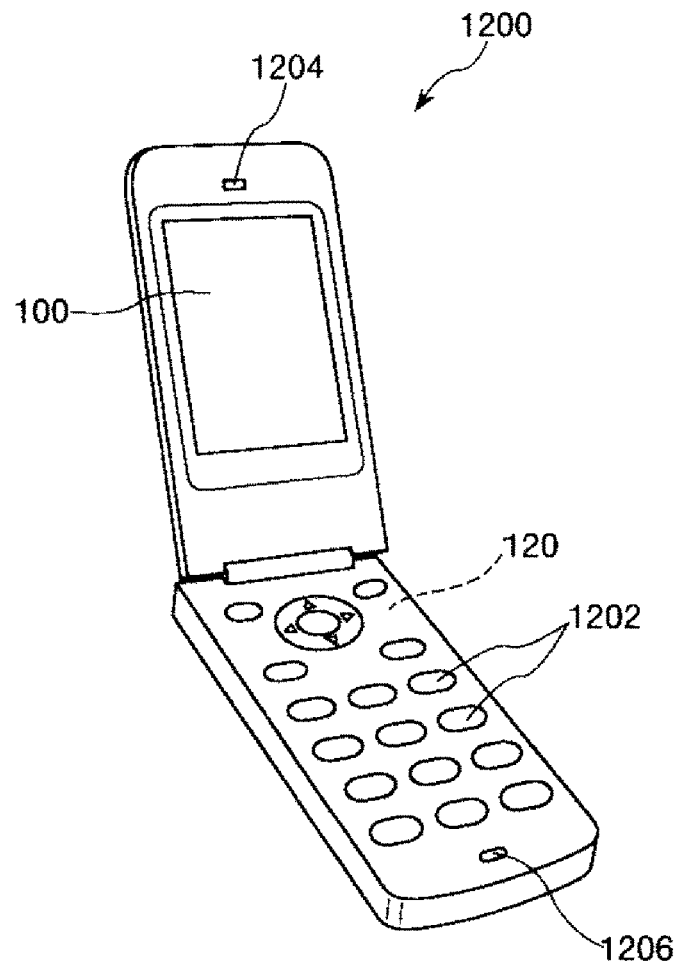
FIG. 17 is a perspective view showing the configuration of a mobile phone (PHS is also included) to which an electronic apparatus including an electric wiring layer of an embodiment of the invention is applied.

FIG. 17 is a perspective view showing the configuration of a mobile phone (PHS is also included) to which the electronic apparatus including the electric wiring layer according to the invention is applied. In FIG. 12, a mobile phone 1200 includes a plurality of operation buttons 1202, an earpiece 1204, and a mouthpiece 1206, and the display portion 100 is disposed between the operation buttons 1202 and the earpiece 1204. The base 120 (electric wiring layer) having an electric circuit formed therein is provided in the mobile phone 1200.

Figure 18:
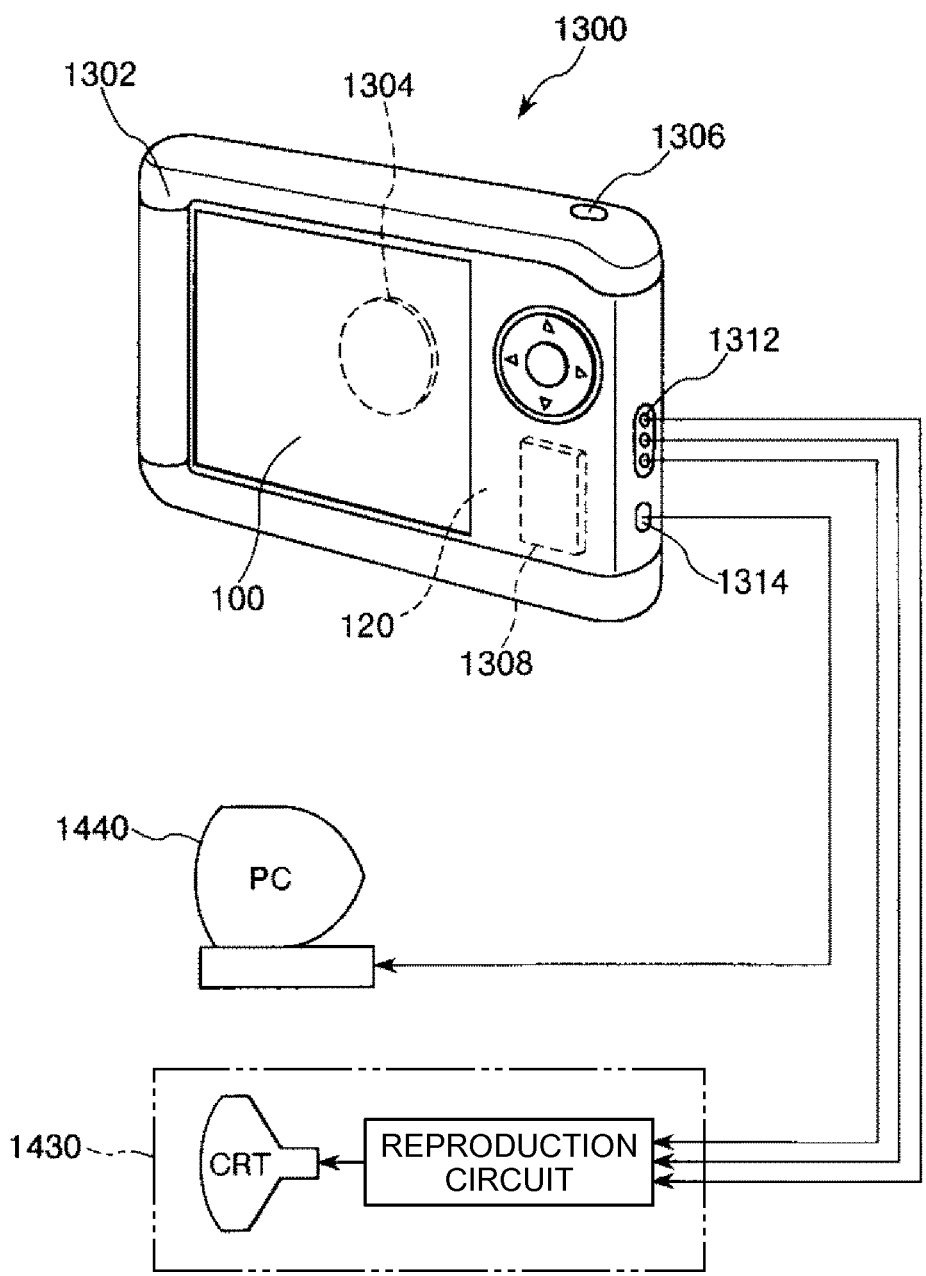
FIG. 18 is a perspective view showing the configuration of a digital still camera to which an electronic apparatus including an electric wiring layer of an embodiment of the invention is applied.

FIG. 18 is a perspective view showing the configuration of a digital still camera to which the electronic apparatus including the electric wiring layer according to the invention is applied. Meanwhile, connection with an external device is simply shown in FIG. 18. Here, a silver halide photograph film is exposed to light according to an optical image of a subject in a typical camera, while a digital still camera 1300 generates an imaging signal (image signal) by performing photoelectric conversion of an optical image of a subject using an imaging element, such as a charge coupled device (CCD).

A display portion is provided on the back of a case (body) 1302 in the digital still camera 1300, so that display based on the imaging signal of the CCD is performed. The display portion functions as a viewfinder that displays a subject as an electronic image. In addition, a light receiving unit 1304 including an optical lens (imaging optical system), a CCD, and the like is provided on the front side (back side in FIG. 18) of the case 1302.

When a photographer checks a subject image displayed on the display unit and presses a shutter button 1306, an imaging signal of the CCD at that point in time is transferred and stored in a memory 1308. In addition, in the digital still camera 1300, a video signal output terminal 1312 and an input/output terminal for data communication 1314 are provided on the side surface of the case 1302. In addition, as shown in FIG. 18, a television monitor 1430 is connected to the video signal output terminal 1312 and a personal computer 1440 is connected to the input/output terminal for data communication 1314 when necessary. In addition, an imaging signal stored in the memory 1308 may be output to the television monitor 1430 or the personal computer 1440 by a predetermined operation. The base 120 (electric wiring layer) having an electric circuit formed therein is provided in the digital still camera 1300.

Meanwhile, the electronic apparatus including the electric wiring layer according to the invention can be applied not only to the personal computer (mobile personal computer) shown in FIG. 16, the mobile phone shown in FIG. 17, and the digital still camera shown in FIG. 18 but also, for example, to an ink jet type discharge apparatus (for example, an ink jet printer), a laptop type personal computer, a television, a video camera, a video tape recorder, a car navigation apparatus, a pager, an electronic organizer (an electronic organizer with a communication function is also included), an electronic dictionary, an electronic calculator, an electronic game machine, a word processor, a workstation, a video phone, a television monitor for security, electronic binoculars, a POS terminal, medical equipment (for example, an electronic thermometer, a sphygmomanometer, a blood sugar meter, an electrocardiographic measurement device, an ultrasonic diagnostic apparatus, and an electronic endoscope), a fish finder, various measurement apparatuses, instruments (for example, instruments for vehicles, aircrafts, and ships), a flight simulator, and the like.

Moving Object

Next, a moving object (moving object according to the invention) which includes the electric wiring layer according to the invention will be described.

Figure 19:
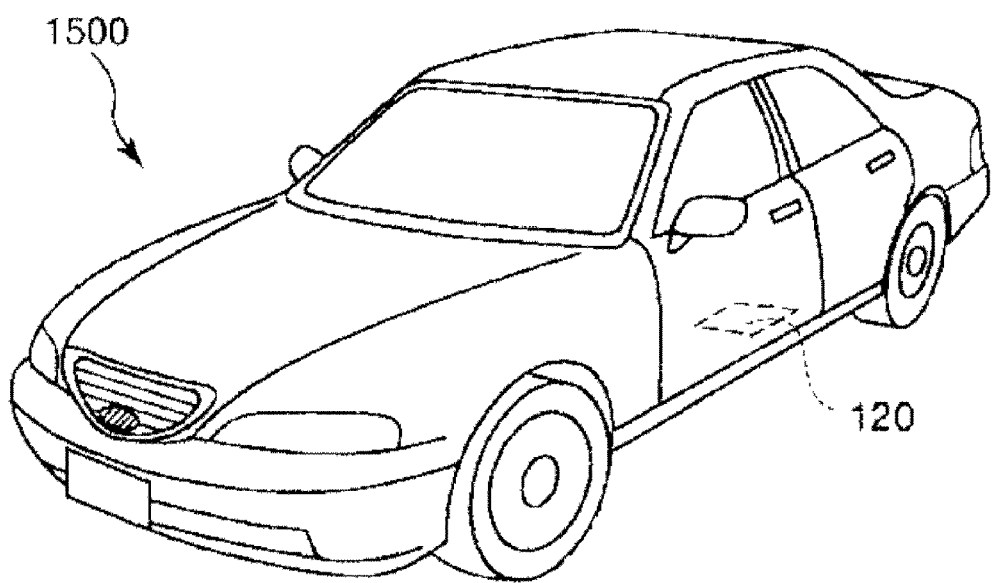
FIG. 19 is a schematic perspective view showing a vehicle as an example of a moving object of an embodiment of the invention.

FIG. 19 is a schematic perspective view showing a vehicle as an example of the moving object according to the invention. The base 120 (electric wiring layer) having an electric circuit formed therein is mounted in a vehicle 1500. The base 120 can be widely applied to an electronic control unit (ECU), such as a keyless entry, an immobilizer, a car navigation system, a car air-conditioner, an anti-lock brake system (ABS), an airbag, a tire pressure monitoring system (TPMS), an engine control, a battery monitor of a hybrid vehicle or an electric vehicle, and a vehicle body position control system.

While the invention has been described with reference to the preferred embodiments, the invention is not limited thereto, and the configuration of each portion may be replaced with an arbitrary configuration having the same function.

In the invention, an arbitrary component may be added to the above-described embodiments, and the embodiments may be appropriately combined with each other.

EXAMPLE

Next, a specific example of the invention will be described.
1. Manufacture of Sample
Sample 1

1. First, a metal powder (metal particle) of an Fe-3.5Si-4.5Cr-based alloy which is manufactured by a water atomization method was prepared. The metal powder is an Fe-based alloy powder containing Cr of 4.5 mass % and Si of 3.5 mass %. Meanwhile, an average particle size of the metal powder was 10 μm.

In addition, a powder (first glass powder) of a phosphate-based glass (first glass material) containing tin oxide was prepared. The powder is a powder of a $SnO—P_2O_5—MgO$-based glass. Meanwhile, an average particle size of the first glass powder was 3 μm and a softening point of the first glass material was 390° C.

Next, the metal powder and the first glass powder were put into a friction mixer to generate a mechanical compressed frictional action. Thereby, the first glass material was fixed to the surface of a metal particle to thereby obtain a metal particle with an insulating layer.

An average thickness of a surface insulating layer which was obtained by calculation was 60 nm.

Next, the obtained metal particle with an insulating layer was mixed with a second glass powder, which is the same as the first glass powder, to thereby obtain a mixed powder. When the sum of the volume of the metal particles with an insulating layer and the volume of the second glass powder in the mixed powder was set to 100, the mixing was performed so that the volume of the second glass powder was set to 50.

2. Next, the obtained mixed powder is molded using a press molding machine. Thereby, a plate-shaped pressed powder molded layer was obtained. The obtained pressed powder molded layer had a disk shape, and the diameter thereof was 40 mm and the thickness thereof was 0.5 mm. In addition, the molding pressure was 40 MPa (0.4 t/cm$^2$).

Subsequently, the obtained pressed powder molded layer was heated. Thereby, the second glass material was fused and the pressed powder molded layer was solidified. At this time, a heating temperature was 400° C. and a heating atmosphere was a nitrogen gas atmosphere.

3. Next, in the obtained pressed powder molded layer, regions (two places) where a through electric wiring is to be formed was irradiated with a laser. Thereby, metal particles in the irradiation region were coupled to each other to thereby exert conductivity. As a result, the through electric wiring was formed.

Meanwhile, the irradiation region of the laser had a circular shape having a diameter of 200 μm, and the irradiation was performed so that the coupling between the metal particles was performed until the pressed powder molded layer was penetrated.

In addition, a YAG laser was used as a laser oscillation source, and the wavelength of the oscillated laser was set to 1064 nm.

In this manner, a sample including the through electric wiring was obtained.
Samples 2 to 5

A sample including a through electric wiring was obtained in the same manner as in Sample 1 except that the manufacturing conditions were changed as shown in Table 1.
Sample 6

A sample including a through electric wiring was obtained in the same manner as in Sample 1 except that the mixing with the second glass powder was omitted.
Samples 7 to 10

A sample including a through electric wiring was obtained in the same manner as in Sample 1 except that the manufacturing conditions were changed as shown in Table 1.
Sample 11

A sample including a through electric wiring was obtained in the same manner as in Sample 1 except that the material of the metal powder was changed to Cu and the materials of the first and second glass materials were changed to a $Bi_2O_3$—

$B_2O_3$—ZnO-based glass. Meanwhile, details of the manufacturing conditions are as shown in Table 1.

In addition, a softening point of the $Bi_2O_3$—$B_2O_3$—ZnO-based glass was 405° C. and a heating temperature of the pressed powder molded layer was 450° C.

Samples 12 to 15

A sample including a through electric wiring was obtained in the same manner as in Sample 11 except that the manufacturing conditions were changed as shown in Table 1.

Sample 16

A sample including a through electric wiring was obtained in the same manner as in Sample 11 except that the mixing with the second glass powder was omitted.

Samples 17 to 20

A sample including a through electric wiring was obtained in the same manner as in Sample 11 except that the manufacturing conditions were changed as shown in Table 1.

Samples 21 to 26

A sample including a through electric wiring was obtained in the same manner as in Sample 1 except that the manufacturing conditions were changed as shown in Table 2.

Sample 27

A sample including a through electric wiring was obtained in the same manner as in Sample 1 except that an alumina powder was added together with the second glass powder. Meanwhile, a powder having an average particle size of 3 μm was used as the alumina powder. When the sum of the volume of the metal particle with an insulating layer, the volume of the second glass powder, and the volume of the alumina powder in the mixed powder was set to 100, the mixing was performed so that the volume of the alumina powder was set to 5.

Sample 28

A sample including a through electric wiring was obtained in the same manner as in Sample 27 except that the addition of an alumina powder was omitted and the second glass powder was added by the amount of omission of the alumina powder.

Sample 29

Polypropylene particles were used instead of the first glass powder to thereby obtain a metal particle with an insulating layer. An average thickness of the insulating layer was 200 μm and a softening point of polypropylene was 150° C.

Next, the metal particle with an insulating layer was molded using a press forming machine in the same manner as in Sample 1.

Next, in the obtained pressed powder molded layer, a region where a through electric wiring is to be formed was irradiated with a laser. Thereby, a sample including a through electric wiring was obtained.

Meanwhile, details of the manufacturing conditions are as shown in Table 2.

Sample 30

A sample including a through electric wiring was obtained in the same manner as in Sample 29 except that the manufacturing conditions were changed as shown in Table 2.

Sample 31

Polypropylene particles were used instead of the first glass powder to thereby obtain a metal particle with an insulating layer. An average thickness of the insulating layer was 350 μm and a softening point of polypropylene was 150° C.

Next, a mixed powder of the metal particles with an insulating layer and the polypropylene particles was molded using a press forming machine in the same manner as in Sample 1.

Next, in the obtained pressed powder molded layer, a region where a through electric wiring is to be formed was irradiated with a laser. Thereby, a sample including a through electric wiring was obtained.

Meanwhile, details of the manufacturing conditions are as shown in Table 2.

Sample 32

A sample including a through electric wiring was obtained in the same manner as in Sample 31 except that the manufacturing conditions were changed as shown in Table 2.

Sample 33

A sample including a through electric wiring was obtained in the same manner as in Sample 1 except that the formation of a surface insulating layer was omitted.

Sample 34

A sample including a through electric wiring was obtained in the same manner as in Sample 11 except that the formation of a surface insulating layer was omitted.

Up to now, the manufacturing conditions of the samples are shown in Table 1 and Table 2. Meanwhile, among the samples shown in Table 1 and Table 2, the sample corresponding to the invention is set to be an "Example", and the samples which do not correspond to the invention are set to be a "Comparative Example" or a "Reference Example".

TABLE 1

| | | Manufacturing conditions of samples including through electric wiring | | | | | |
|---|---|---|---|---|---|---|---|
| | | Metal particle | | Surface insulating layer | | | |
| | | Material | Average particle size μm | Material | Softening point of first glass material ° C. | Average particle size of first glass powder μm | Average thickness nm |
| Sample 1 | Example | Fe—Si—Cr | 10 | SnO—$P_2O_5$—MgO | 390 | 3.0 | 60 |
| Sample 2 | Example | Fe—Si—Cr | 10 | SnO—$P_2O_5$—MgO | 390 | 3.0 | 60 |
| Sample 3 | Example | Fe—Si—Cr | 10 | SnO—$P_2O_5$—MgO | 390 | 3.0 | 60 |
| Sample 4 | Example | Fe—Si—Cr | 10 | SnO—$P_2O_5$—MgO | 390 | 3.0 | 60 |
| Sample 5 | Example | Fe—Si—Cr | 10 | SnO—$P_2O_5$—MgO | 390 | 3.0 | 60 |
| Sample 6 | Example | Fe—Si—Cr | 10 | SnO—$P_2O_5$—MgO | 390 | 3.0 | 60 |
| Sample 7 | Example | Fe—Si—Cr | 10 | SnO—$P_2O_5$—MgO | 390 | 3.0 | 60 |
| Sample 8 | Example | Fe—Si—Cr | 10 | SnO—$P_2O_5$—MgO | 390 | 3.0 | 60 |
| Sample 9 | Example | Fe—Si—Cr | 10 | SnO—$P_2O_5$—MgO | 390 | 3.0 | 60 |
| Sample 10 | Example | Fe—Si—Cr | 10 | SnO—$P_2O_5$—MgO | 390 | 3.0 | 60 |
| Sample 11 | Example | Cu | 5.5 | $Bi_2O_3$—$B_2O_3$—ZnO | 405 | 2.0 | 45 |
| Sample 12 | Example | Cu | 5.5 | $Bi_2O_3$—$B_2O_3$—ZnO | 405 | 2.0 | 45 |

TABLE 1-continued

| | | | | | | | |
|---|---|---|---|---|---|---|---|
| Sample 13 | Example | Cu | 5.5 | $Bi_2O_3$—$B_2O_3$—ZnO | 405 | 2.0 | 45 |
| Sample 14 | Example | Cu | 5.5 | $Bi_2O_3$—$B_2O_3$—ZnO | 405 | 2.0 | 45 |
| Sample 15 | Example | Cu | 5.5 | $Bi_2O_3$—$B_2O_3$—ZnO | 405 | 2.0 | 45 |
| Sample 16 | Example | Cu | 5.5 | $Bi_2O_3$—$B_2O_3$—ZnO | 405 | 2.0 | 45 |
| Sample 17 | Example | Cu | 5.5 | $Bi_2O_3$—$B_2O_3$—ZnO | 405 | 2.0 | 45 |
| Sample 18 | Example | Cu | 5.5 | $Bi_2O_3$—$B_2O_3$—ZnO | 405 | 2.0 | 45 |
| Sample 19 | Example | Cu | 5.5 | $Bi_2O_3$—$B_2O_3$—ZnO | 405 | 2.0 | 45 |
| Sample 20 | Example | Cu | 5.5 | $Bi_2O_3$—$B_2O_3$—ZnO | 405 | 2.0 | 45 |

Manufacturing conditions of samples including through electric wiring

Interparticle insulating portion

| | | Material | Softening point of second glass material °C. | Average particle size of second glass powder μm | Volume ratio — | Note |
|---|---|---|---|---|---|---|
| Sample 1 | Example | SnO—$P_2O_5$—MgO | 390 | 3.0 | 50 | |
| Sample 2 | Example | SnO—$P_2O_5$—MgO | 390 | 3.0 | 40 | |
| Sample 3 | Example | SnO—$P_2O_5$—MgO | 390 | 3.0 | 30 | |
| Sample 4 | Example | SnO—$P_2O_5$—MgO | 390 | 3.0 | 20 | |
| Sample 5 | Example | SnO—$P_2O_5$—MgO | 390 | 3.0 | 10 | |
| Sample 6 | Example | — | — | — | 0 | |
| Sample 7 | Example | SnO—$P_2O_5$—MgO | 390 | 3.0 | 55 | |
| Sample 8 | Example | SnO—$P_2O_5$—MgO | 390 | 3.0 | 60 | |
| Sample 9 | Example | SnO—$P_2O_5$—MgO | 390 | 3.0 | 65 | |
| Sample 10 | Example | SnO—$P_2O_5$—MgO | 390 | 3.0 | 70 | |
| Sample 11 | Example | $Bi_2O_3$—$B_2O_3$—ZnO | 405 | 2.0 | 50 | |
| Sample 12 | Example | $Bi_2O_3$—$B_2O_3$—ZnO | 405 | 2.0 | 40 | |
| Sample 13 | Example | $Bi_2O_3$—$B_2O_3$—ZnO | 405 | 2.0 | 30 | |
| Sample 14 | Example | $Bi_2O_3$—$B_2O_3$—ZnO | 405 | 2.0 | 20 | |
| Sample 15 | Example | $Bi_2O_3$—$B_2O_3$—ZnO | 405 | 2.0 | 10 | |
| Sample 16 | Example | — | — | — | 0 | |
| Sample 17 | Example | $Bi_2O_3$—$B_2O_3$—ZnO | 405 | 2.0 | 55 | |
| Sample 18 | Example | $Bi_2O_3$—$B_2O_3$—ZnO | 405 | 2.0 | 60 | |
| Sample 19 | Example | $Bi_2O_3$—$B_2O_3$—ZnO | 405 | 2.0 | 65 | |
| Sample 20 | Example | $Bi_2O_3$—$B_2O_3$—ZnO | 405 | 2.0 | 70 | |

TABLE 2

Manufacturing conditions of samples including through electric wiring

| | | Metal particle | | Surface insulating layer | | | |
|---|---|---|---|---|---|---|---|
| | | Material | Average particle size μm | Material | Softening point of first glass material °C. | Average particle size of first glass powder μm | Average thickness nm |
| Sample 21 | Example | Cu | 8 | $SiO_2$—$Al_2O_3$—$B_2O_3$ | 660 | 3.5 | 55 |
| Sample 22 | Example | Cu | 8 | $SiO_2$—$Al_2O_3$—$B_2O_3$ | 660 | 3.5 | 55 |
| Sample 23 | Example | Cu | 8 | $SiO_2$—$Al_2O_3$—$B_2O_3$ | 660 | 3.5 | 55 |
| Sample 24 | Example | Cu | 12 | $SiO_2$—$B_2O_3$—ZnO | 540 | 4.5 | 120 |
| Sample 25 | Example | Cu | 12 | $SiO_2$—$B_2O_3$—ZnO | 540 | 4.5 | 120 |
| Sample 26 | Example | Cu | 12 | $SiO_2$—$B_2O_3$—ZnO | 540 | 4.5 | 120 |
| Sample 27 | Example | Cu | 10 | SnO—$P_2O_5$—MgO | 390 | 3.0 | 60 |
| Sample 28 | Example | Cu | 10 | SnO—$P_2O_5$—MgO | 390 | 3.0 | 60 |
| Sample 29 | Comparative Example | Fe—Si—Cr | 10 | Polypropylene | 150 | — | 200 |
| Sample 30 | Comparative Example | Cu | 5.5 | Polypropylene | 150 | — | 100 |
| Sample 31 | Comparative Example | Fe—Si—Cr | 10 | Polypropylene | 150 | — | 350 |
| Sample 32 | Comparative Example | Cu | 5.5 | Polypropylene | 150 | — | 175 |
| Sample 33 | Reference Example | Fe—Si—Cr | 10 | — | — | — | — |
| Sample 34 | Reference Example | Cu | 5.5 | — | — | — | — |

TABLE 2-continued

Manufacturing conditions of samples including through electric wiring

| | | Interparticle insulating portion | | | | |
|---|---|---|---|---|---|---|
| | | Material | Softening point of second glass material ° C. | Average particle size of second glass powder μm | Volume ratio — | Note |
| Sample 21 | Example | $SiO_2$—$B_2O_3$—ZnO | 540 | 4.5 | 50 | |
| Sample 22 | Example | $SiO_2$—$B_2O_3$—ZnO | 540 | 4.5 | 35 | |
| Sample 23 | Example | $SiO_2$—$B_2O_3$—ZnO | 540 | 4.5 | 65 | |
| Sample 24 | Example | $Bi_2O_3$—ZnO—$B_2O_3$ | 450 | 3.0 | 50 | |
| Sample 25 | Example | $Bi_2O_3$—ZnO—$B_2O_3$ | 450 | 3.0 | 35 | |
| Sample 26 | Example | $Bi_2O_3$—ZnO—$B_2O_3$ | 450 | 3.0 | 65 | |
| Sample 27 | Example | SnO—$P_2O_5$—MgO | 390 | 3.0 | 45 | Including $Al_2O_3$ powder |
| Sample 28 | Example | SnO—$P_2O_5$—MgO | 390 | 3.0 | 50 | Not including $Al_2O_3$ powder |
| Sample 29 | Comparative Example | — | — | — | 0 | |
| Sample 30 | Comparative Example | — | — | — | 0 | |
| Sample 31 | Comparative Example | Polypropylene | 150 | — | 50 | |
| Sample 32 | Comparative Example | Polypropylene | 150 | — | 50 | |
| Sample 33 | Reference Example | SnO—$P_2O_5$—MgO | 390 | 3.0 | 50 | |
| Sample 34 | Reference Example | $Bi_2O_3$—$B_2O_3$—ZnO | 405 | 2.0 | 50 | |

2. Evaluation of Sample 2.1 Evaluation of Conductivity

First, a resistance value of the through electric wiring was measured by a four-terminal method with respect to the samples obtained in the examples and the comparative examples. In addition, conductivity was evaluated on the basis of the following evaluation criteria. Meanwhile, a digital multimeter was used for the measurement, and an applied current was set to 1 mA.

Evaluation Criteria of Conductivity

A: resistance value is extremely small (less than 5 mΩ)

B: resistance value is small (equal to or greater than 5 mΩ and less than 25 mΩ)

C: resistance value is slightly small (equal to or greater than 25 mΩ and less than 50 mΩ)

D: resistance value is slightly large (equal to or greater than 50 mΩ and less than 75 mΩ)

E: resistance value is large (equal to or greater than 75 mΩ and less than 100 mΩ)

F: resistance value is extremely large (equal to or greater than 100 mΩ)

2.2 Evaluation of Insulation Property

Next, the insulation resistance of an insulating region was measured using a tester with respect to the samples obtained in the examples and the comparative examples. In addition, an insulation property was evaluated on the basis of the following evaluation criteria.

Evaluation Criteria of Insulation Property

A: resistance value is extremely large (equal to or greater than $1×10^{13}$ Ω)

B: resistance value is large (equal to or greater than $1×10^{12}$ Ω and less than $1×10^{13}$ Ω)

C: resistance value is slightly large (equal to or greater than $1×10^{11}$ Ω and less than $1×10^{12}$ Ω)

D: resistance value is slightly small (equal to or greater than $1×10^{10}$ Ω and less than $1×10^{11}$ Ω)

E: resistance value is small (equal to or greater than $1×10^{9}$ Ω and less than $1×10^{10}$ Ω)

F: resistance value is extremely small (less than $1×10^{9}$ Ω)

2.3 Evaluation of Airtightness

Next, airtightness was measured using a leakage detector (vacuum method) with respect to the samples obtained in the examples and the comparative examples. In addition, the airtightness was evaluated on the basis of the following evaluation criteria. Meanwhile, helium gas was used for the detection of leakage.

Evaluation Criteria of Airtightness

A: the amount of leakage is particularly small (less than $1×10^{-8}$ Pa·m³/s)

B: the amount of leakage is small (equal to or greater than $1×10^{-8}$ Pa·m³/s and less than $1×10^{-7}$ Pa·m³/s)

C: the amount of leakage is slightly small (equal to or greater than $1×10^{-7}$ Pa·m³/s and less than $1×10^{-6}$ Pa·m³/s)

D: the amount of leakage is slightly large (equal to or greater than $1×10^{-6}$ Pa·m³/s and less than $1×10^{-5}$ Pa·m³/s)

E: the amount of leakage is large (equal to or greater than $1×10^{-5}$ Pa·m³/s and less than $1×10^{-4}$ Pa·m³/s)

F: the amount of leakage is particularly large (equal to or greater than $1×10^{-4}$ Pa·m³/s)

2.4 Evaluation of Heat Resistance

Next, soldering work using Pb—Sn eutectic solder (melting point: 186° C.) was performed on the samples obtained in the examples and the comparative examples. In addition, airtightness was evaluated on the samples having been subjected to the work, in the same manner as in 2.3.

Evaluation Criteria of Heat Resistance

A: heat resistance is particularly high (less than $1×10^{-8}$ Pa·m³/s)

B: heat resistance is high (equal to or greater than $1×10^{-8}$ Pa·m³/s and less than $1×10^{-7}$ Pa·m³/s)

C: heat resistance is slightly high (equal to or greater than $1×10^{-7}$ Pa·m³/s and less than $1×10^{-6}$ Pa·m³/s)

D: heat resistance is slightly low (equal to or greater than $1\times10^{-6}$ Pa·m³/s and less than $1\times10^{-5}$ Pa·m³/s)

E: heat resistance is low (equal to or greater than $1\times10^{-5}$ Pa·m³/s and less than $1\times10^{-4}$ Pa·m³/s)

F: heat resistance is particularly low (equal to or greater than $1\times10^{-4}$ Pa·m³/s)

2.5 Evaluation of Mechanical Strength

Next, folding strength resistance was measured on the samples obtained in the examples and the comparative examples, on the basis of a testing method specified in JIS C 5016. In addition, the folding strength resistance of Sample 29 was set to 1, and a relative value of the folding strength resistance of each sample was obtained. Then, the folding strength resistance was evaluated on the basis of the following evaluation criteria.

Evaluation Criteria of Mechanical Strength

A: relative value of folding strength resistance is equal to or larger than 5

B: relative value of folding strength resistance is equal to or greater than 4 and less than 5

C: relative value of folding strength resistance is equal to or greater than 3 and less than 4

D: relative value of folding strength resistance is equal to or greater than 2 and less than 3

E: relative value of folding strength resistance is greater than 1 and less than 2

F: relative value of folding strength resistance is equal to or less than 1

The above evaluation results are shown in Table 3 and Table 4.

TABLE 3

| | Evaluation results | | | | |
|---|---|---|---|---|---|
| | Conductivity | Insulation property | Airtightness | Heat resistance | Mechanical strength |
| Sample 1 | A | A | A | A | B |
| Sample 2 | A | A | A | A | B |
| Sample 3 | A | B | A | A | B |
| Sample 4 | A | B | B | A | B |
| Sample 5 | A | C | B | A | C |
| Sample 6 | A | C | C | B | C |
| Sample 7 | A | A | A | A | B |
| Sample 8 | A | A | A | A | B |
| Sample 9 | B | A | A | A | B |
| Sample 10 | C | A | A | A | B |
| Sample 11 | A | A | A | A | B |
| Sample 12 | A | A | A | A | B |
| Sample 13 | A | B | A | A | B |
| Sample 14 | A | B | B | A | B |
| Sample 15 | A | C | B | A | C |
| Sample 16 | A | C | C | B | C |
| Sample 17 | A | A | A | A | B |
| Sample 18 | A | A | A | A | B |
| Sample 19 | B | A | A | A | B |
| Sample 20 | C | A | A | A | B |

TABLE 4

| | Evaluation results | | | | |
|---|---|---|---|---|---|
| | Conductivity | Insulation property | Airtightness | Heat resistance | Mechanical strength |
| Sample 21 | A | A | A | A | A |
| Sample 22 | A | A | A | A | A |
| Sample 23 | A | A | A | A | A |
| Sample 24 | A | A | A | A | A |
| Sample 25 | A | A | A | A | B |
| Sample 26 | A | A | A | A | B |
| Sample 27 | A | A | A | A | A |
| Sample 28 | A | A | A | A | B |
| Sample 29 | B | F | F | F | F |
| Sample 30 | B | F | F | F | F |
| Sample 31 | B | F | F | F | E |
| Sample 32 | B | F | F | F | E |
| Sample 33 | A | D | E | B | B |
| Sample 34 | A | D | E | B | B |

As is apparent from Table 3 and Table 4, it was seen that the samples equivalent to the examples have excellent characteristics as an electric wiring layer.

The entire disclosure of Japanese Patent Application No. 2013-272610, filed Dec. 27, 2013 is expressly incorporated by reference herein.

What is claimed is:

1. A method of manufacturing an electric wiring layer including an electric wiring, the method comprising:
   obtaining a pressed powder molded layer by pressurizing a powder including a metal particle with an insulating layer, the metal particle being constituted by a metal particle having conductivity and a surface insulating layer which is located on a surface of the metal particle and which mainly contains a glass material; and
   irradiating the pressed powder molded layer with energy rays and forming the electric wiring in an irradiation region.

2. The method according to claim 1,
   wherein the metal particle with an insulating layer is manufactured by fixing the glass material to the surface of the metal particle.

3. The method according to claim 1,
   wherein the pressed powder molded layer is obtained by pressurizing a powder containing the metal particle with an insulating layer and a glass particle.

4. The method according to claim 3,
   wherein a constituent material of the glass material is the same as that of the glass particle.

5. The method according to claim 3,
   wherein when a sum of a volume of the metal particle with an insulating layer and a volume of the glass particle in the pressed powder molded layer is set to 100, the volume of the glass particle is equal to or less than 65.

6. The method according to claim 1, further comprising heating the pressed powder molded layer.

7. The method according to claim 1,
   wherein the metal particle is manufactured by a water atomization method or a high speed rotation water flow atomization method.

8. A member for forming an electric wiring layer, the member comprising:
   a pressed powder molded layer which includes a metal particle with an insulating layer, the metal particle being constituted by a metal particle having conductivity and a surface insulating layer which is located on a surface of the metal particle and which mainly contains a glass material, wherein the member for forming an electric wiring layer is a member which exerts conductivity in an irradiation region by irradiating a portion thereof with energy rays and is capable of forming an electric wiring.

9. An electric wiring layer comprising:

an insulating region which includes a metal particle with an insulating layer, the metal particle being constituted by a metal particle having conductivity and a surface insulating layer which is located on a surface of the metal particle and which mainly contains a glass material; and an electric wiring which includes a particle-coupled body in which metal particles having conductivity are coupled to each other, wherein the insulating region and the electric wiring are integrally formed.

10. A vibrator comprising:

a package which includes the electric wiring layer according to claim 9 and a lid member which is bonded to the electric wiring layer or an electric wiring board; and a vibrator element which is accommodated in the package.

11. An electronic apparatus comprising the electric wiring layer according to claim 9.

12. A moving object comprising the electric wiring layer according to claim 9.

13. A method of manufacturing an electric wiring board which includes a substrate and an electric wiring layer including an electric wiring which is provided on one surface side of the substrate, the method comprising:

obtaining a pressed powder molded layer by pressurizing a powder including a metal particle with an insulating layer on the substrate, the metal particle being constituted by a metal particle having conductivity and a surface insulating layer which is located on a surface of the metal particle and which mainly contains a glass material; and obtaining the electric wiring layer by irradiating the pressed powder molded layer with energy rays and by forming the electric wiring in an irradiation region.

14. A member for forming an electric wiring board, the member comprising:

a substrate; and a pressed powder molded layer which is provided on one surface side of the substrate and includes a metal particle with an insulating layer, the metal particle being constituted by a metal particle having conductivity and a surface insulating layer which is located on a surface of the metal particle and which mainly contains a glass material, wherein the member for forming an electric wiring board is a member which exerts conductivity in an irradiation region by irradiating a portion of the pressed powder molded layer with energy rays and which is capable of forming an electric wiring.

15. An electric wiring board comprising:

a substrate; and an electric wiring layer which is provided on one surface side of the substrate and includes an insulating region and an electric wiring, wherein the insulating region includes a metal particle with an insulating layer being constituted by a metal particle having conductivity and a surface insulating layer which is located on a surface of the metal particle and which mainly contains a glass material, and the electric wiring includes a particle-coupled body in which metal particles having conductivity are coupled to each other, wherein the insulating region and the electric wiring are integrally formed in the electric wiring layer.

16. A vibrator comprising:

a package which includes the electric wiring board according to claim 15 and a lid member which is bonded to the electric wiring layer or the electric wiring board; and a vibrator element which is accommodated in the package.

17. An electronic apparatus comprising the electric wiring board according to claim 15.

18. A moving object comprising the electric wiring board according to claim 15.

* * * * *